United States Patent
Danno et al.

(10) Patent No.: US 7,777,309 B2
(45) Date of Patent: Aug. 17, 2010

(54) AMPLIFIER CHIP MOUNTED ON A LEAD FRAME

(75) Inventors: Tadatoshi Danno, Takasaki (JP); Tsutomu Tsuchiya, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 358 days.

(21) Appl. No.: 12/033,061

(22) Filed: Feb. 19, 2008

(65) Prior Publication Data

US 2008/0135960 A1    Jun. 12, 2008

Related U.S. Application Data

(62) Division of application No. 10/512,459, filed as application No. PCT/JP03/05475 on Apr. 28, 2003, now Pat. No. 7,425,756.

(30) Foreign Application Priority Data

Apr. 30, 2002  (WO) ................. PCT/JP02/04339
Sep. 5, 2002   (JP) ......................... 2002-260255

(51) Int. Cl.
   *H01L 23/495*   (2006.01)
   *H01L 21/00*    (2006.01)
   *H01R 9/00*     (2006.01)

(52) U.S. Cl. .............. 257/672; 257/674; 257/676; 257/692; 257/784; 257/786; 257/E23.031; 257/E23.043; 257/E23.052; 361/773; 361/813; 438/123

(58) Field of Classification Search .............. None
See application file for complete search history.

(56) References Cited

U.S. PATENT DOCUMENTS

| | | | |
|---|---|---|---|
| 6,104,078 A | 8/2000 | Iida et al. | 257/524 |
| 6,198,171 B1 | 3/2001 | Huang et al. | 257/787 |
| 6,281,568 B1 | 8/2001 | Glenn et al. | 257/684 |

(Continued)

FOREIGN PATENT DOCUMENTS

CN    1340858 A    3/2002

(Continued)

*Primary Examiner*—Alonzo Chambliss
(74) *Attorney, Agent, or Firm*—Miles & Stockbridge P.C.

(57) ABSTRACT

This invention provides a high frequency power module which is incorporated into a mobile phone and which incorporates high frequency portion analogue signal processing ICs including low noise amplifiers which amplify an extremely weak signal therein. A semiconductor device includes a sealing body which is made of insulation resin, a plurality of leads which are provided inside and outside the sealing body, a tab which is provided inside the sealing body and has a semiconductor element fixing region and a wire connection region on a main surface thereof, a semiconductor element which is fixed to the semiconductor element fixing region and includes electrode terminals on an exposed main surface, conductive wires which connect electrode terminals of the semiconductor element and the leads, and conductive wires which connect electrode terminals of the semiconductor element and the wire connecting region of the tab. In such a semiconductor device, a circuit formed in the semiconductor element in a monolithic manner is comprised of a plurality of circuit parts and, in a specified circuit part (a low noise amplifier) which forms a portion of the circuit parts, all grounding electrode terminals out of electrode terminals of the semiconductor element are not connected to the tab through wires but are connected with the leads through wires.

17 Claims, 28 Drawing Sheets

U.S. PATENT DOCUMENTS

| | | |
|---|---|---|
| 6,624,509 B2 | 9/2003 | Takikawa et al. |
| 6,628,170 B2 | 9/2003 | Titus .......................... 330/278 |
| 6,686,652 B1 | 2/2004 | Bayan et al. ................ 257/678 |
| 7,013,123 B2 | 3/2006 | Takikawa et al. ............ 455/333 |
| 7,312,511 B2 * | 12/2007 | Danno et al. ................ 257/503 |
| 7,425,756 B2 * | 9/2008 | Danno et al. ................ 257/672 |

FOREIGN PATENT DOCUMENTS

| | | |
|---|---|---|
| EP | 1187208 | 3/2002 |
| JP | 11-186921 | 7/1999 |
| JP | 11-251494 | 9/1999 |
| JP | 2000-91489 | 3/2000 |
| JP | 2001-189402 | 7/2001 |
| JP | 2001-313363 | 11/2001 |
| JP | 2002-26222 | 1/2002 |
| JP | 2002-76235 | 3/2002 |

* cited by examiner

FIG. 23
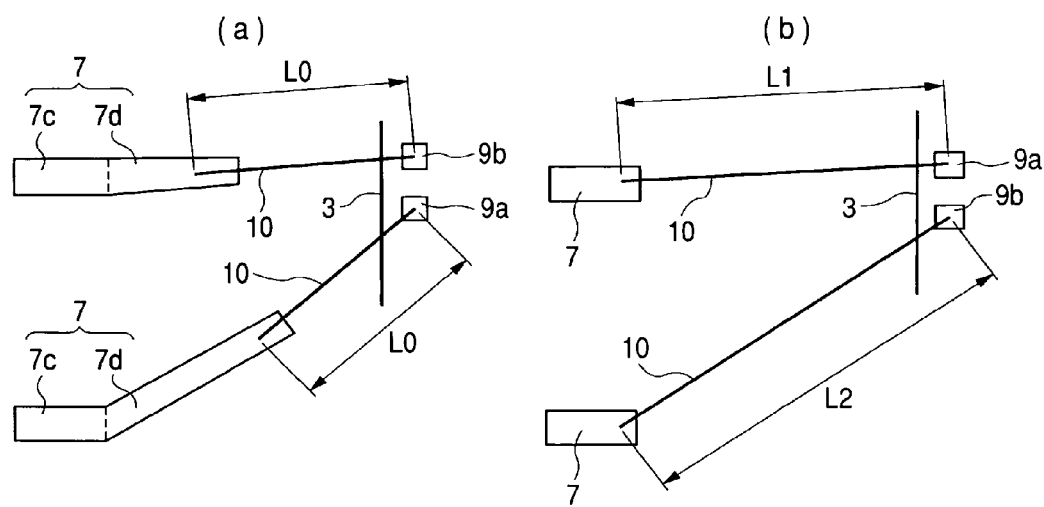
FIG. 24
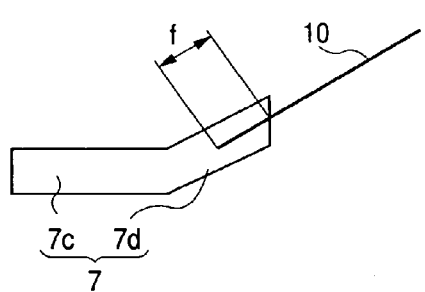
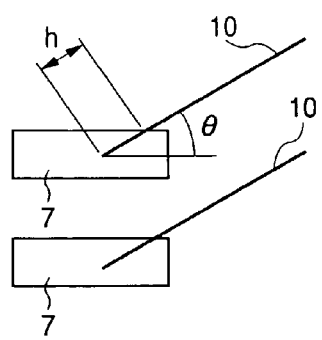

AMPLIFIER CHIP MOUNTED ON A LEAD FRAME

CROSS-REFERENCE TO RELATED APPLICATION

This application is a division of U.S. application Ser. No. 10/512,459 filed Oct. 26, 2004, which is a 371 of International Application No. PCT/JP03/05475 filed Apr. 28, 2003. This application is also related to U.S. application Ser. No. 11/455,157 filed Jun. 19, 2006 (now U.S. Pat. No. 7,312,511).

TECHNICAL FIELD

The present invention relates to a semiconductor device and an electronic device and to a technique which is effectively applicable to, for example, a high frequency power module (semiconductor device) and a radio communication device (electronic device) which incorporate high frequency part analogue signal processing IC including a low noise amplifier (LNA: Law Noise Amplifier) for amplifying extremely weak signals.

BACKGROUND ART

Mobile communication equipment (a mobile terminal) such as a mobile phone is configured to cope with a plurality of communication systems. That is, in a transmission/reception unit (a front end) of the mobile phone, a plurality of circuit systems is incorporated to perform the transmission/reception of a plurality of communication systems. For example, as a method which enables a call between mobile phones (for example, cellular phones) which differ in the communication method (system), a dual band communication method has been known. With respect to the dual band method, there have been known a dual band method which adopts a GSM (Global System for Mobile Communication) using a carrier frequency band of 880 to 915 MHz and a DCS-1800 (Digital Cellular System 1800) using a carrier frequency band of 1710 to 1785 MHz and a high frequency power amplifier for dual bands.

Further, in Japanese Unexamined Patent Publication No. Hei 11 (1999)-186921 (laid open to public inspection on Jul. 9, 1999), a multiple band mobile body communication device which is applicable to mobile phone systems such as a PCN (Personal Communication Network: DCS-1800), PCS (Personal Communications Service: DCS-1900), GSM and the like is disclosed.

Further, at a front end of the mobile phone, a high frequency part analogue signal processing circuit for GSM is formed into a module. For example, there has been known a RF (Radio Frequency) power module for GSM of a dual band or a triple band using a MOSFET (Metal Oxide Semiconductor Field-Effect-Transistor).

The dual band method processes signals of two communication systems such as the GSM method and the DCS 1800 method, while the triple band method processes signals of three communication systems such as the dual band method, the DCS (Digital Cellular System) 1800 and the PCS 1900 method. As the GSM, a GSM900 or a GSM 850 is incorporated.

Further, in the high frequency power module, one-chip semiconductor element which is formed by integrating an LNA, a mixer, a PLL (Phase-Locked Loop) synthesizer, auto-calibration-added PGA (Programmable Gain Amplifier), an IQ modulator/demodulator, an offset PLL, a VCO (Voltage-Controlled Oscillator) and the like in a monolithic manner is incorporated.

Further, in Japanese Unexamined Patent Publication No. 2002-76235 discloses a dual band transmission/reception semiconductor integrated circuit. A differential low noise amplifier (comprised of two unit amplifiers in which signals having phases inverted from each other are inputted) which is incorporated into the dual band transmission/reception semiconductor integrated circuit includes a pair of input terminals and a pair of output terminals, wherein ground pins of the amplifier formed of a pair of differential amplifiers are arranged close to each other. Further, input pins and the ground pins of the same amplifier are arranged close to each other. Accordingly, this patent literature discloses a technique to enhance the gain of the differential amplifier in which by making the signals of neighboring pins have phases inverse from each other and by making use of the transformer junction between pins, the impedance applied to the transistor emitter can be reduced.

On the other hand, there has been a demand for the miniaturization and the reduction of weight with respect to the mobile phone for facilitating the carrying of the mobile phone. As a result, there has been a demand for the miniaturization and the reduction of weight also with respect to electronic parts such as the high frequency power module or the like.

There exist various semiconductor devices depending on the packaging modes and, as one of these semiconductor devices, there has been known a non-lead type semiconductor device which exposes leads (external electrode terminals) on a back surface (mounting surface) of a sealing body (package) made of insulation resin and prevents the projection of long leads from side surface of the sealing body.

As the non-lead type semiconductor device, a SON (Small Outline Non-Leaded Package) which exposes leads along two opposing sides on a back surface of the sealing body and a QFN (Quad Flat Non-leaded Package) which exposes leads on four sides on a back surface of the sealing body can be named. The non-lead type semiconductor device which is miniaturized and is free from bending of leads is described in Japanese Unexamined Patent Publication No. 2001-313363, for example.

The resin-sealed type semiconductor device described in this literature has the following structure. That is, the semiconductor device includes an island having a die pad to which a semiconductor chip is fixed and a wire bonding portion to which wires are connected, wherein the semiconductor chip is fixed to the die pad and respective electrode terminals of the semiconductor chip are connected with the leads and the wire bonding portion of the island. A gap is defined between the die pad and the wire bonding portion so as to prevent the separation or the cutting of the bonded wire due to a thermal stress. In such the structure, by connecting an earth terminal of the semiconductor chip and the island using a wire, the semiconductor chip can be connected with a printed circuit board or the like using the island as a ground lead.

Further, in Japanese Unexamined Patent Publication No. Hei 11 (1999)-251494, there is a description with respect to a high frequency device in which the lead structure which is used in a mobile phone or the like and grounds a semiconductor element mounting portion adopts a gull wing type. In the technique, while electrodes of the semiconductor element are connected with leads using wires, a die pad is made use of as a grounding electrode and hence, the electrodes of the semiconductor element and a semiconductor mounting portion are connected with each other using wires (down-bonding). To perform the down-bonding, the semiconductor element mounting portion is configured such that the semiconductor element mounting portion is made larger than the semiconductor element and, in amounted state, a peripheral portion of the semiconductor element mounting portion projects to the outside of the semiconductor element, and the wires are connected to these portions.

The applicant of the present invention has studied the adoption of a technique in which a high frequency power module is incorporated into the non-lead type semiconductor device and, for stabilizing the ground potential, ground terminals of respective circuit parts which comprise the high frequency power module are electrically connected with tabs by wires. By adopting the down-bonding, the number of external electrode terminals can be decreased and hence, the package can be minimized whereby the semiconductor device can be eventually miniaturized.

However, it has been found that the following drawbacks arise with respect to the high frequency power module which is used for the radio communication system (communication system).

In the reception system of the mobile phone, although signals which are caught with an antenna are amplified by a low noise amplifier (LNA), the input signals are extremely weak. Accordingly, the potential of the tab which is the common terminal, that is, the ground potential is fluctuated or changed in response to the operation of the respective circuit parts, particularly the operation of an oscillator which is periodically operated. Due to such fluctuation of the ground potential, a crosstalk is generated between some circuit parts and hence, the output is fluctuated whereby it is impossible to conduct a favorable call.

Particularly, the distortion of signal waveforms attributed to an induced current caused by the crosstalk between leads or the fluctuation of the ground potential is outputted from the communication system and the output signals enter the communication system in use thus generating noises.

As the circuit parts which are liable to easily receive the influence of the fluctuation of the ground potential and the crosstalk, an RFVCO (high frequency voltage control oscillator) and the like can be named besides the low noise amplifier (LNA).

In view of the above, inventors of the present invention come up with an idea that with respect to the low noise amplifier or RFVCO, instead of connecting the ground terminals among the electrode terminals of the semiconductor element with the tab which serves as the common terminal using the wires, the ground terminals are connected with an independent lead terminal (external electrode terminal) using wires so that the influence of the fluctuation of the ground potential when other circuit parts are turned on or off can be reduced. Then, the inventions have arrived at the present invention.

Accordingly, it is an object of the present invention to provide a semiconductor device provided with the down-bonding structure, wherein among circuits which are formed in the semiconductor element, the ground potentials in the specified circuit parts are configured to hardly receive the influence of the ground potential of remaining circuit parts.

It is another object of the present invention to provide a high frequency power module in which a circuit part such as a low noise amplifier, an RFVCO or the like hardly receives the influence of a crosstalk generated due to the fluctuation of the ground potential in other circuit part.

It is still another object of the present invention to provide a radio communication device which enables a favorable call with small noises in a radio communication system.

It is still another object of the present invention to provide a radio communication device which enables a favorable call with small noises in a radio communication system which includes a plurality of communication systems.

On the other hand, the inventors of the present invention have analyzed and studied a two-input-method low noise amplifier (LNA: differential low noise amplifier) in which signals which have phases thereof inverted from each other) (complementary signals) are inputted. FIG. 34A and FIG. 34B respectively show circuit parts including a low noise amplifier (LNA) 100, a high frequency voltage control oscillator (FEVCO) 101 and a mixer 102, wherein FIG. 34A indicates one-input-method LNA and FIG. 34B indicates two-input-method LNA.

In the circuit constitution which mixes an output signal from the low noise amplifier 100 which processes a reception signal from an antenna and a signal from a local oscillator (RFVCO: high frequency voltage control oscillator) 101 in a mixer 102, in the low noise amplifier having the one input constitution shown in FIG. 34A, the output frequency of the RFVCO 101 becomes equal to the output frequency of the LNA100 and hence, when the output signal of the RFVCO 101 leaks into the LNA input line, the output signal is directly amplified at the LNA100 and hence, there arises a drawback that an DC offset is increased.

Accordingly, as shown in FIG. 34B, by adopting the two-input method in which a differential low noise amplifier (differential amplifier: LNA) is used as the LNA100 and signals which have phases thereof inverted from each other (complementary signals) are inputted, a DC offset is set to a small value. That is, the differential amplifier (differential amplifying circuit) 100 is comprised of two unit amplifiers having the same constitution and performs the differential amplification when two high frequency signals (complementary signals) (which have phases thereof inverted from each other) are inputted. Accordingly, the components having the same phase are cancelled and hence, it is possible to suppress the DC offset value to a small value.

However, it is found that when the carrier frequency band is further elevated, the single use of the above-mentioned two-input system which inputs the complementary signals cannot fundamentally solve the drawback on the above-mentioned DC offset. An input wiring path which allows the inputting of the above-mentioned complementary signals is roughly classified into a lead portion which is formed of a lead frame and a wire portion which connects the lead portion and electrodes of the semiconductor chip.

For example, the lead portion which is formed of a plate member made of metal such as copper has relatively large thickness and width and hence, the difference in inductance due to the minute difference in lead length of several mm is small. However, with respect to the wire portion where the diameter is approximately 20 to 30 μm, the large difference in inductance is liable to be generated due to the difference in length of the wire portion. This difference in wire inductance can be expressed as the difference in inputting time of two complementary input signals and hence, the pair characteristics of the input signals is impaired. As a result, in the high-speed communication system, the above-mentioned circuit part is not favorable with respect to a point that the gain is lowered.

Accordingly, it is another object of the present invention to enhance the pair characteristics of input signals in a circuit part which simultaneously inputs complementary signals to the differential low noise amplifier.

It is still another object of the present invention to enhance the characteristics (reduction of a DC offset) of the high frequency power module having the differential low noise amplifier.

The above-mentioned and other objects and novel features will become apparent from the description of this specification and attached drawings.

DISCLOSURE OF THE INVENTION

To briefly explain the summary of representative inventions among the inventions disclosed in the present application, they are as follows.

(1) A semiconductor device of the present invention is a semiconductor device (for example, a non-lead type semiconductor device) which includes a sealing body which is made of insulation resin;

a plurality of leads which are provided along a periphery of the sealing body as well as inside and outside the sealing body;

a tab which has a main surface and a back surface;

a semiconductor chip which has a main surface and a back surface and includes a plurality of electrode terminals and a plurality of circuit parts each of which is respectively comprised of a plurality of semiconductor elements on the main surface;

a plurality of conductive wires which connect the plurality of electrode terminals and the leads; and a plurality of conductive wires which connect the plurality of electrode terminals and the main surface of the tab, wherein the back surface of the semiconductor chip is fixed to the main surface of the tab, the plurality of circuit parts include first circuit parts (specified circuit parts) and second circuit parts, the plurality of electrode terminals include first electrode terminals for inputting external signals to the first circuit parts, second electrode terminals for supplying the first potential (ground potential) to the first circuit parts, third electrode terminals which are connected with the second circuit parts, and fourth electrode terminals which supply the first potential to the second circuit parts, the plurality of leads include first leads (leads for signals), second leads (leads for signals), and third leads (leads for grounding) which are arranged between the first leads and the second leads, the first electrode terminals are connected with the first leads through conductive wires, the second electrode terminals are connected with the third leads through conductive wires, the third electrode terminals are connected with the second leads through conductive wires, the fourth electrode terminals are connected with the tab which serves as a common ground through conductive wires, and the third leads and the fourth leads are electrically separated from each other thus forming a high frequency module.

The first circuit parts are amplifying circuits (low noise amplifiers: LAN) for amplifying external signals which are inputted through the first electrode terminals and are circuits for amplifying electric signals which are converted from radio signals through the antenna.

The second circuit parts have at least a portion of a function of processing the signals amplified by the first circuit parts.

Further, in the high frequency power modules, a plurality of communication circuits is formed to cope with a plurality of communication methods. These high frequency power modules are incorporated into the radio communication device.

According to the above-mentioned means (1), (a) the electrode terminals of the semiconductor element are not only connected with the leads through the wires but also are connected with the tab which forms the common ground (down-bonding). The grounding electrode terminal (electrode terminal of the semiconductor element) of the low noise amplifier (specified circuit part) which amplifies the extremely weak signal is not connected with the tab and is connected with the independent lead terminal (lead for grounding) and hence, the ground potential becomes independent with respect to the other circuit part whereby the fluctuation of the ground potential is hardly generated even when the power source of other circuit part is turned on or off, the fluctuation of the output of the low noise amplifier and the distortion of the signal waveforms attributed to the fluctuation of the ground potential are hardly generated. Accordingly, by incorporating the semiconductor device into the radio communication device, it is possible to provide a call which is free from the fluctuation of output and the distortion.

(b) In the high frequency power module having the plurality of communication circuits, with respect to the common ground which uses the tab, along with the fluctuation of the ground potential, the induced current is generated in the communication circuit which is not used and the noises attributed to this induced current intrude into the communication circuit in use (in operation), that is, the crosstalk is generated. However, in the high frequency power module of the present invention, since the low noise amplifiers of the respective communication circuits are separated from the ground of another circuit part, it is possible to suppress the fluctuation of the output of the low noise amplifier and the distortion of the signal waveforms. As a result, even in the radio communication device having the plurality of communication circuits, it is possible to perform a favorable call having no fluctuation of output and no distortion.

(c) The signal lines which reach the leads from the electrode terminals of the low noise amplifier through the wires electromagnetically shielded in a state that the ground lines are arranged at both sides of the signal line and hence, the cross talk between the signal lines can be reduced.

(d) The high frequency power module is the non-lead type semiconductor device having the down-bonding structure and hence, it is possible to enhance the miniaturization, the reduction of thickness and the reduction of weight of the semiconductor. Further, since the tab is exposed to the back surface of the sealing body, the heat radiation property is favorable thus ensuring the stable operation. Accordingly, by incorporating the high frequency power module into the mobile phone, it is possible to provide the miniaturized and light-weighted mobile phone which exhibits the favorable call performance.

BRIEF DESCRIPTION OF THE DRAWINGS

FIG. 23 is a schematic view showing an example of a pattern of leads and wires in the embodiment 5 in a differential amplifying circuit part of the high frequency power module where the wire inductances of a pair of input parts are arranged and an example of a pattern of leads and wires in the embodiment 5 in the differential amplifying circuit part of the high frequency power module where the wire inductances of a pair of input part are not arranged.

FIG. 24 is a schematic view for explaining the difference in reliability of wire connection due to the difference in the lead pattern shown in FIG. 23.

BEST MODE FOR CARRYING OUT THE INVENTION

Hereinafter, embodiments of the present invention are explained in detail in conjunction with drawings. Here, in all drawings which are served for explaining the embodiments of the invention, parts having identical functions are given same symbols and their repeated explanation is omitted.

Embodiment 1

Figure 12:
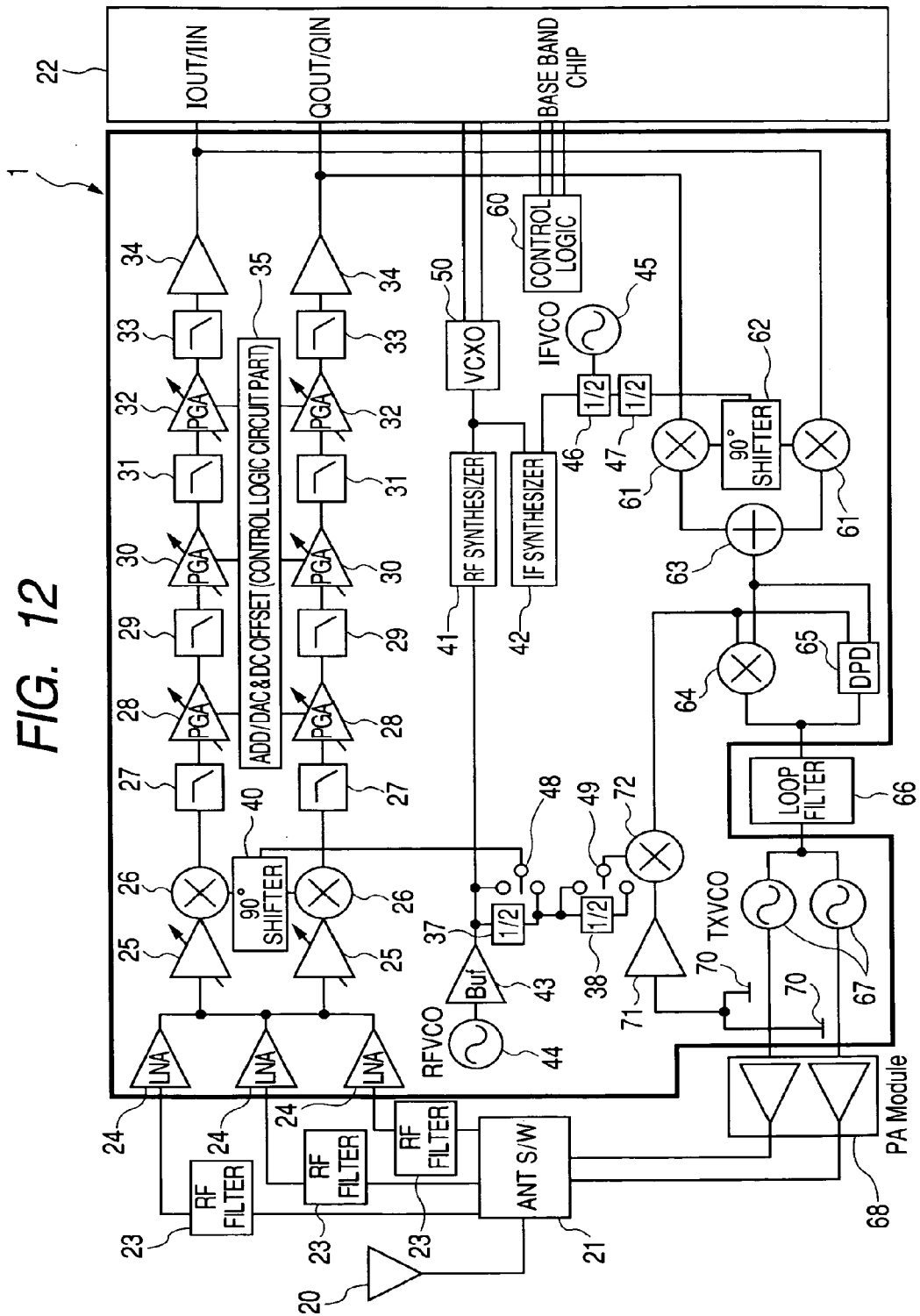
FIG. 12 is a block diagram showing the circuit constitution of a mobile phone in which the high frequency power module of the embodiment 1 is incorporated.
Figure 13:
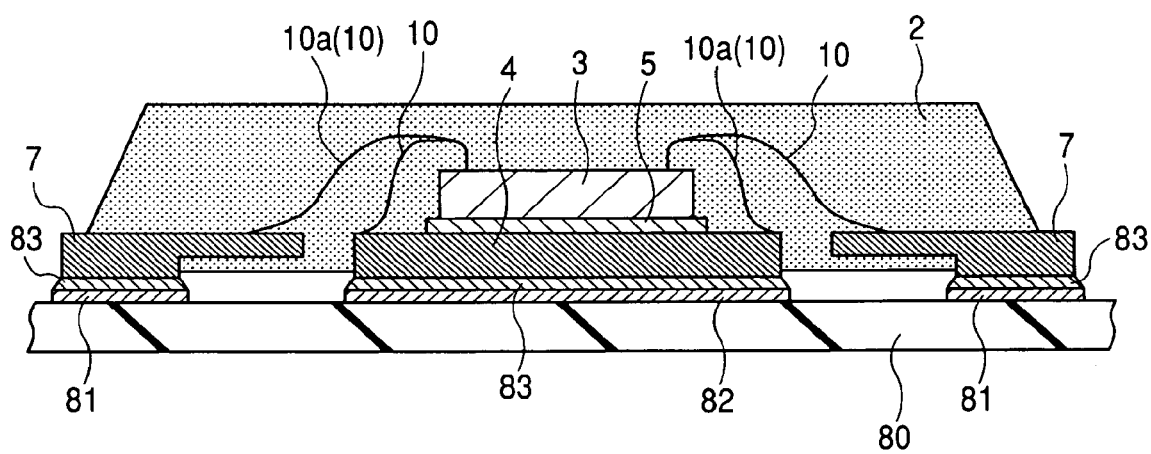
FIG. 13 is a schematic cross-sectional view showing a mounted state of the high frequency power module of the embodiment 1 in the mobile phone.

FIG. 1 to FIG. 13 are views related to a semiconductor device (high frequency power module) of one embodiment (embodiment 1) of the present invention and a radio communication device in which the high frequency power module is incorporated. FIG. 1 to FIG. 5 are views related with the high frequency power module, FIG. 6 to FIG. 11 are views related to a manufacturing method of the high frequency power module, and FIG. 12 and FIG. 13 are views related to a radio communication device.

In this embodiment 1, the explanation is made with respect to an example in which the present invention is applied to a QFN type semiconductor device in which a tab, tab suspending leads contiguously formed with the tab and leads (external electrode terminals) are exposed on a mounting surface formed over a back surface of a quadrangular sealing body (package). The semiconductor device 1 forms the high frequency power module, for example.

Figure 1:
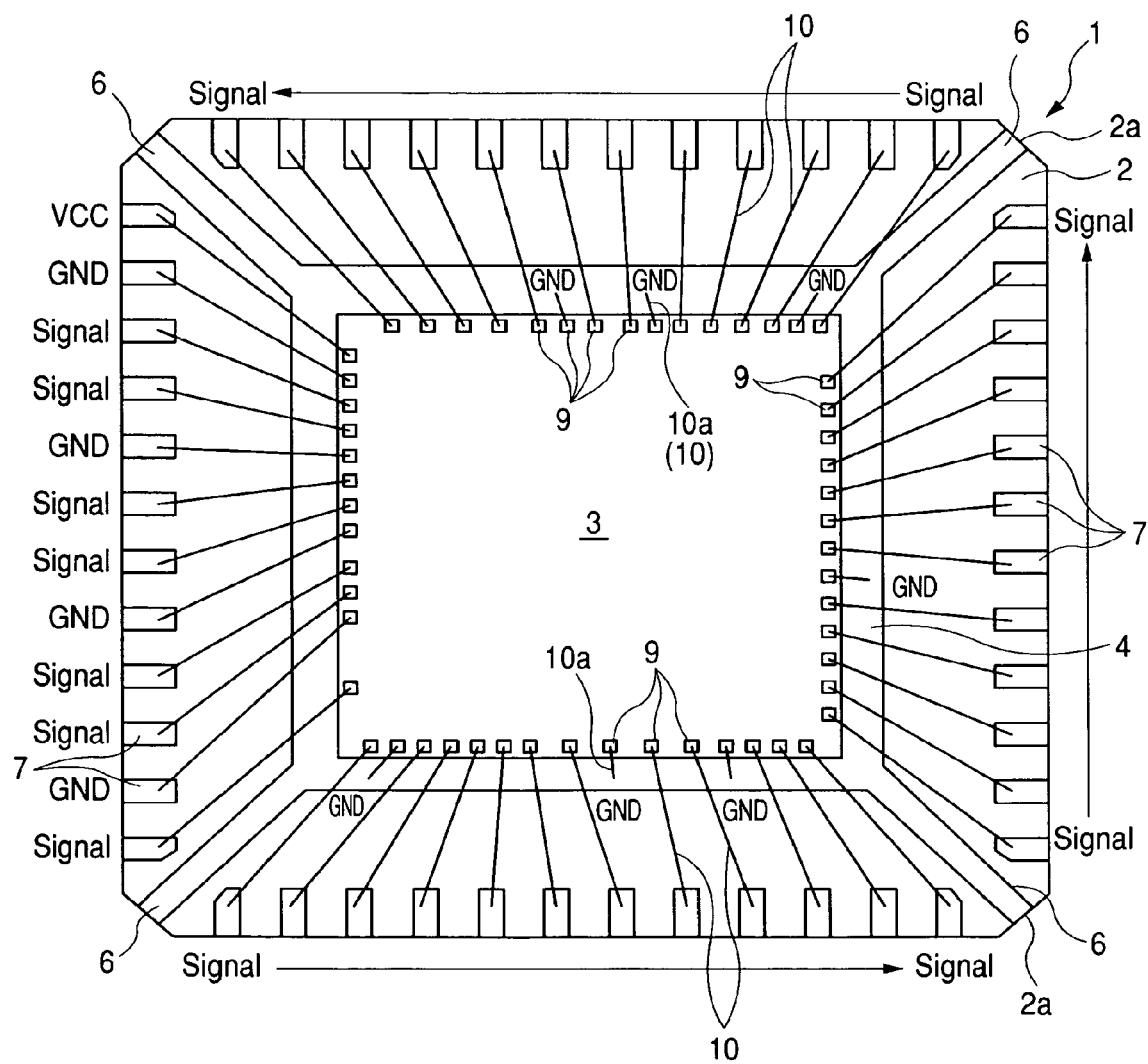
FIG. 1 is a schematic plan view of a high frequency power module of one embodiment (embodiment 1) of the present invention in a state that a portion of a sealing body is cut away.
Figure 2:
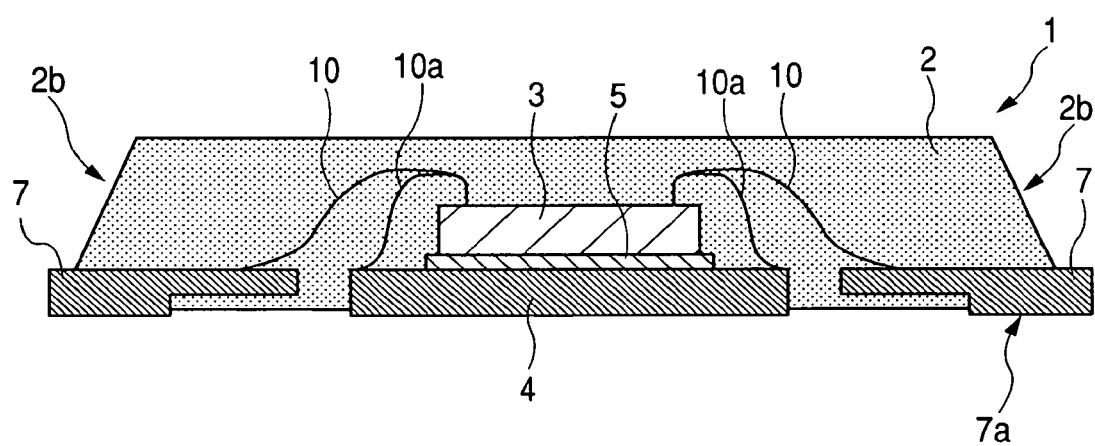
FIG. 2 is a cross-sectional view of the high frequency power module of the embodiment 1.

The QFN type semiconductor device 1, as shown in FIG. 1 and FIG. 2, includes a sealing body (package) 2 which is formed of insulation resin having a flattened quadrangular shape. In the inside of the sealing body 2, a quadrangular semiconductor element (semiconductor chip: chip) 3 is embedded. The semiconductor chip 3 is fixed to a tab surface (main surface) of a quadrangular tab 4 using an adhesive agent 5 (see FIG. 2). As shown in FIG. 2, a back surface (lower surface) of the sealing body 2 is a surface side (mounting surface) on which the semiconductor chip 3 is mounted.

The semiconductor device 1 has the structure in which the tab 4 and tab supporting leads 6 which support the tab 4 and one surface (mounting surface 7a) of leads (external electrode terminals) 7 are exposed on the back surface of the sealing body 2. These tab 4, the tab supporting leads 6 and the leads 7 are, in the manufacture of the semiconductor device 1, formed of one sheet of a lead frame which is made of metal (made of copper, for example) and are, thereafter, cut into respective parts.

Accordingly, in this embodiment 1, the tab 4, the tab supporting leads 6 and the leads 7 have the same thickness. However, the leads 7 are configured such that inner end portions thereof are formed thin by etching back surfaces of the inner end portions and hence, resin which forms the sealing body 2 intrudes into the lower side of the thin lead portions. Accordingly, the removal of the leads 7 from the sealing body 2 is made difficult.

The tab 4 has four corners thereof supported by narrow tab supporting leads 6. These tab supporting leads 6 are positioned on diagonal lines of the quadrangular sealing body 2 and have outer ends thereof face respective corner portions of the quadrangular sealing body 2. The sealing body 2 has a flattened quadrangular shape and corner portions thereof are chamfered to form oblique faces 2a (see FIG. 1). Outer ends of the tab supporting leads 6 slightly project onto the chamfered portions by 0.1 mm or less. The projection length is determined by a cutting mold of a press machine at the time of cutting the tab supporting leads 6 in a lead frame state. For example, the projection length of 0.1 mm or less is selected.

Further, as shown in FIG. 1, on the periphery of the tab 4, a plurality of leads 7 which make inner ends thereof face the tab 4 are arranged along respective sides of the quadrangular sealing body 2 at a given interval. The outer ends of the tab supporting leads 6 and the leads 7 extend to the periphery of the sealing body 2. That is, the leads 7 and the tab supporting leads 6 extend over the inside and the outside of the sealing body 2. The projection length of the leads 7 from the sealing body 2 is, in the same manner as the above-mentioned tab supporting leads 6, determined by a cutting mold of a press machine at the time of cutting the leads 7 in a lead frame state. For example, the leads 7 project from the sealing body 2 by 0.1 mm or less, for example.

Further, side surfaces of the sealing body 2 are formed into inclined surfaces 2b (see FIG. 2). The inclined surfaces 2b are formed as a result of designing the sealing body 2 such that the sealing body 2 is formed over one surface of the lead frame by one-face molding and, thereafter, at the time of removing the sealing body 2 from a cavity of a forming mold, the side surfaces of the cavity are formed into inclined surfaces to facilitate the removal of the forming mold. Here, FIG. 1 is a schematic view in which an upper portion of the sealing body 2 is cut away to allow the watching of the tab 4, the tab supporting leads 6, the lead 7, the semiconductor chip 3 and the like.

Figure 4:
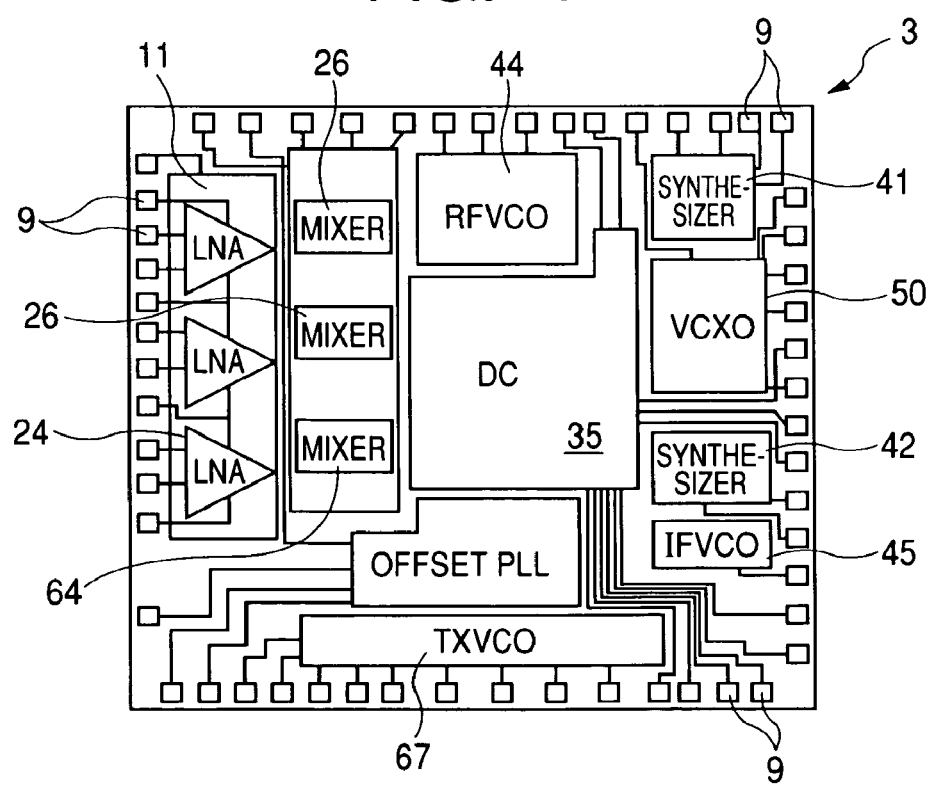
FIG. 4 is a schematic plan view of the circuit constitution as a block of a semiconductor chip which is incorporated into the high frequency power module of the embodiment 1.

Further, as shown in FIG. 1 and FIG. 4, on an exposed main surface of the semiconductor chip 3, electrode terminals 9 are formed over the main surface of the semiconductor chip 3. The electrode terminals 9 are formed along the respective sides of the quadrangular semiconductor chip 3 at an approximately given pitch. These electrode terminals 9 are connected with inner end sides of the leads 7 by way of conductive wires 10.

The tab 4 is formed large compared to the semiconductor chip 3 and has a semiconductor element fixing region at the center of the main surface and, at the same time, a wire connecting region at the outside of the semiconductor element fixing region, that is, on a peripheral portion of the tab 4. Then, the semiconductor chip 3 is fixed to the semiconductor element fixing region, while another ends of the conductive wires 10 which have one ends thereof connected to the electrode terminals 9 of the semiconductor chip 3 are connected to the wire connection region. Particularly, the wires 10 which are connected to the tab 4 are referred to as down-bonding wires 10a. Since the wire bonding between the electrode terminals 9 and the leads 7 and the wire bonding between the electrode terminals 9 and the tab 4 are performed using a wire bonding device, the wires 10a and the down-bonding wires are formed of the same material.

The down-bonding structure is adopted for realizing the common use of a ground potential of respective circuit parts in the inside of the semiconductor chip by making use of the tab. By using the tab as the common ground terminal and by connecting the tab and a large number of electrode terminals which serve as grounding electrode terminals by way of wires, the number of leads (pins) which are the external electrode terminals and are arranged along the periphery of the sealing body can be reduced so that it is possible to miniaturize the sealing body by the reduction of the number of leads. This leads to the miniaturization of the semiconductor device.

Figure 3:
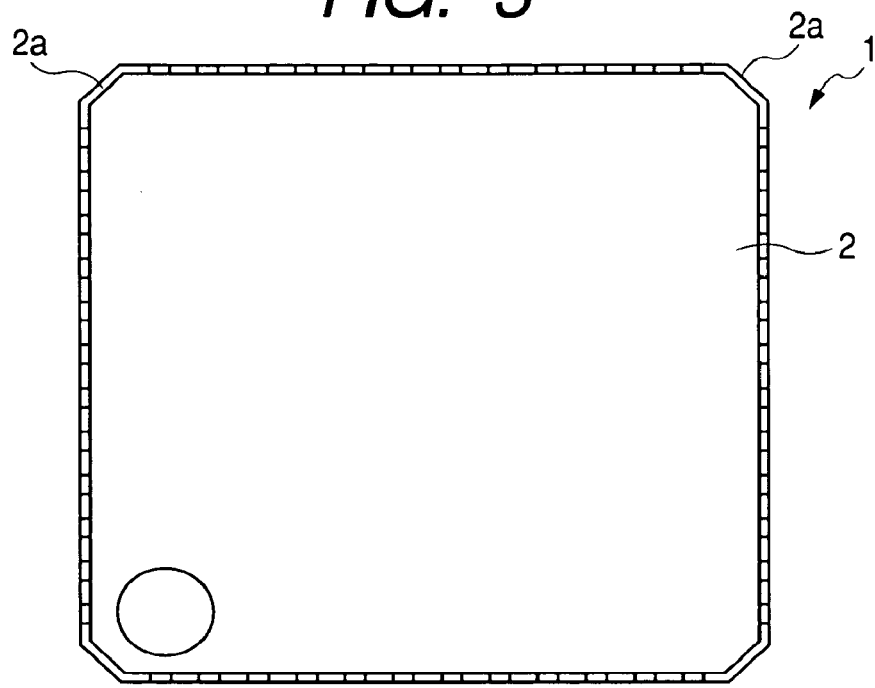
FIG. 3 is a schematic plan view of the high frequency power module of the embodiment 1.

Further, in the semiconductor device 1 of the embodiment 1 is, as shown in FIG. 3, resin burrs which are generated at the time of forming the sealing body 2 are present between the respective leads 7 and the lead 7 as well as between the lead 7 and the tab supporting lead 6. These resin burr portions are generated at the time of forming the sealing body 2 on one surface of the lead frame using one-face molding in the manufacture of the semiconductor device 1. Although dispensable lead frame portions are cut after molding, the resin burrs are also cut simultaneously with cutting of the leads and the tab supporting leads and hence, outer edges of the resin burrs are integrally joined with the edges of the leads 7 and the edges of the tab supporting leads 6 whereby some resin burrs remain between the respective leads 7 and the lead 7 and the lead 7 and the tab supporting lead 6.

Further, in this embodiment 1, the back surface of the sealing body 2 is configured to be recessed from the back surface (mounting surface) of the tab 4, the tab supporting leads 6 and the leads 7. This is because, in the one-face molding in the transfer molding, a resin-made sheet is extended between upper and lower molds of the forming mold and the molding is performed in a state that one surface of the lead frame is brought into contact with the sheet and hence, the sheet is caught in a gap defined in the lead frame whereby the back surface of the sealing body 2 assumes the recessed shape or the indented shape.

Further, after performing the single-sided molding using the transfer molding, a plating film for surface mounting is formed over a surface of the lead frame. Accordingly, although the surfaces of the tab 4, the tab supporting leads 6 and the leads 7 which are exposed on the back surface of the sealing body 2 of the semiconductor device 1 are covered with a plated film although not shown in the drawing.

In this manner, with respect to the offset structure in which the mounting surface which is the back surfaces of the leads 7 and the tab supporting leads 6 projects and the back surface of the sealing body 2 retracts, upon performing the surface mounting of the semiconductor device 1 on a printed circuit board such as a mounting board or the like, the solder mounting can be favorably performed because the regions which become wet by solder are specified.

Here, the manufacturing method of the semiconductor device 1 of this embodiment 1 is explained in conjunction with FIG. 6 to FIG. 11. As shown in the flow chart described in FIG. 6, the semiconductor device 1 is manufactured through respective steps comprising of the preparation of the lead frame (S101), the chip bonding (S102), the wire bonding (S103), sealing (molding: S104), plating processing (S105), and cutting and removing of the dispensable lead frame (S106).

Figure 7:
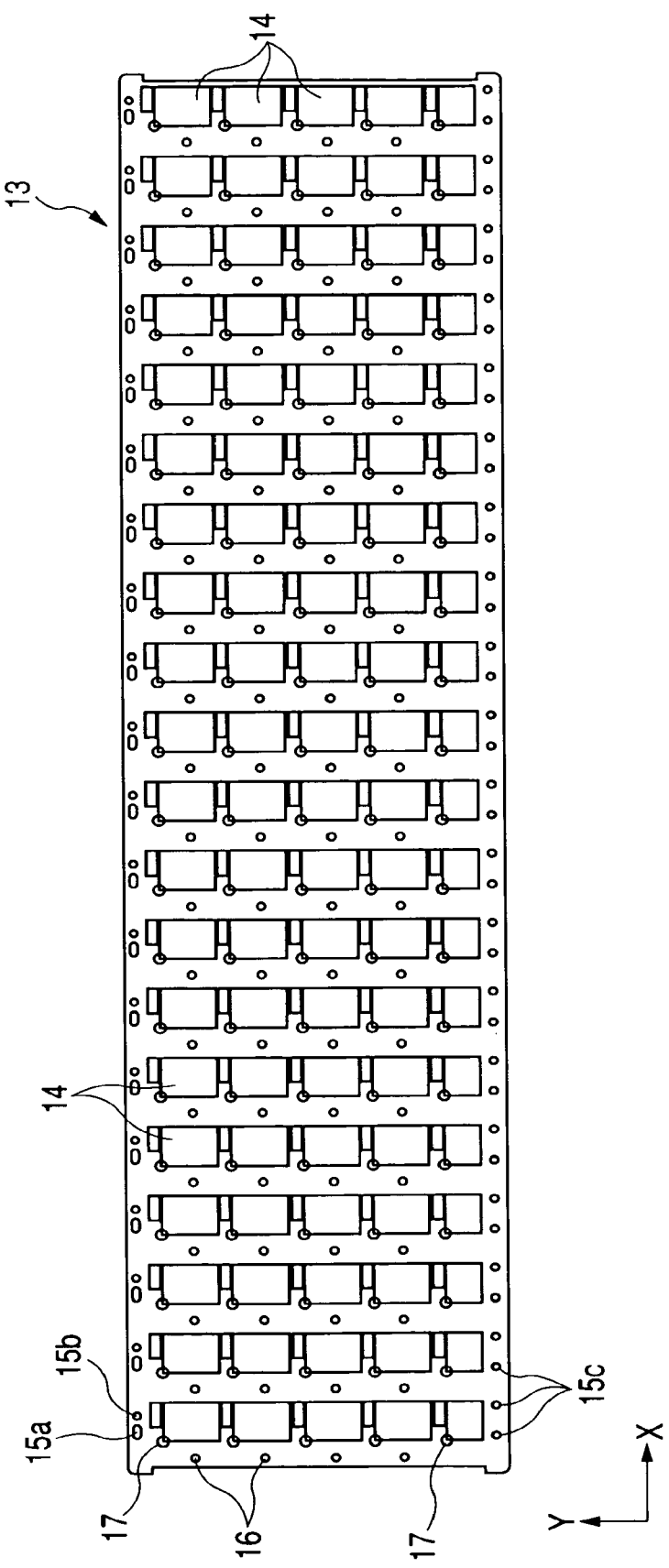
FIG. 7 is a plan view of a lead frame which is used in the manufacture of the high frequency power module of the first embodiment.

FIG. 7 is a schematic plan view of a lead frame 13 having the matrix constitution which is used in manufacturing the QFN type semiconductor device 1 of the first embodiment.

In the lead frame 13, unit lead frame patterns 14 are arranged in 20 rows along the X direction and in 4 columns in the Y direction so that it is possible to manufacture 80 pieces of semiconductor devices 1 from one lead frame 13. Guide holes 15a to 15c which are served for the transfer and positioning of the lead frame 13 are formed in both sides of the lead frame 13.

Further, on the left side of each column of the lead frame 13, runners are positions at the time of performing the transfer molding. Then, to peel off the runner cured resin from the lead frame 13 by projecting ejector pins, ejector pin holes 16 through which the ejector pins penetrate are formed. Further, to peel off gate cured resin which is branched from the runner and is cured at gate portions after flowing into a cavity by projecting ejector pins, ejector pin holes 17 which allow the ejector pins to pass therethrough are formed.

Figure 8:
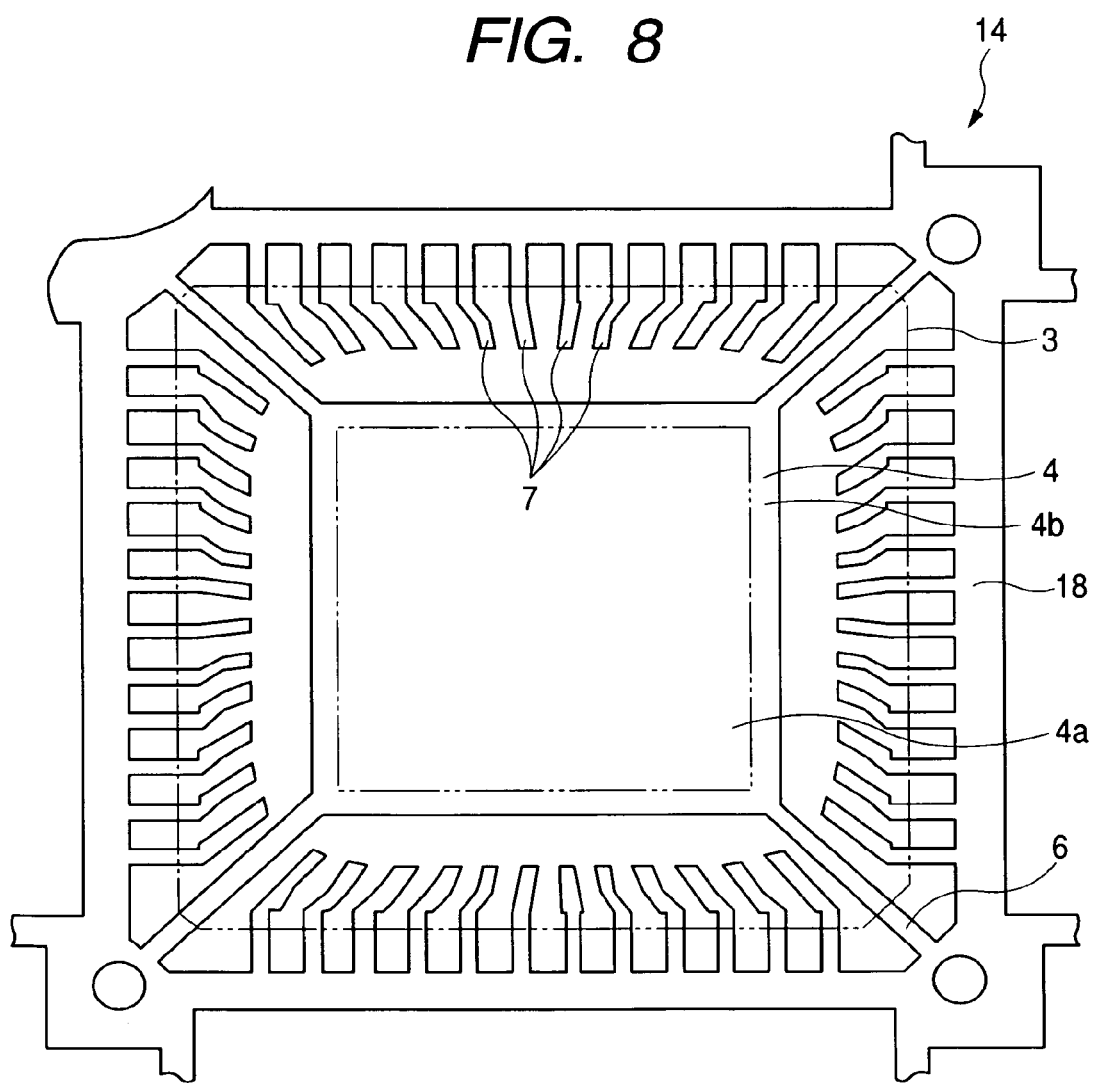
FIG. 8 is a schematic plan view showing a unit lead frame pattern in the lead frame.

FIG. 8 is a plan view showing a portion of the unit lead frame pattern 14. Since the unit lead frame pattern 14 is a pattern which is actually manufactured, there exist some portions which do not agree with FIG. 1 and FIG. 2 which are schematic views.

The unit lead frame pattern 14 has a rectangular frame portion 18. In the pattern, the tab supporting leads 6 extend from four corners of the frame portion 18 and support the tab 4 arranged at the center of the frame portion 18. A plurality of leads 7 extend inwardly from the inside of respective sides of the frame portion 18 and inner ends thereof are arranged close to the outer periphery of the tab 4. On the main surfaces of the tab 4 and the leads 7, a plating film is formed not shown in the drawings for chip bonding or wire bonding.

Further, the leads 7 have back surfaces of distal end sides thereof made thin by half-etching (see FIG. 2). Here, the peripheries of the leads 7, the tab 4 and the like include oblique faces such that a width of the main surface becomes greater than a width of the back surface thus forming an inverted trapezoidal cross section thus providing the structure which makes the removal of the leads 7 and the tab 4 from the sealing body 2 difficult. This structure may be manufactured by etching or using a press.

Further, as shown in FIG. 8, on the main surface of the tab 4, the quadrangular region at the center thereof is a semiconductor element mounting portion 4a (region surrounded by a chain double-dashed line) and a region outside the semiconductor element mounting portion 4a is a wire connecting region 4b.

Figure 9:
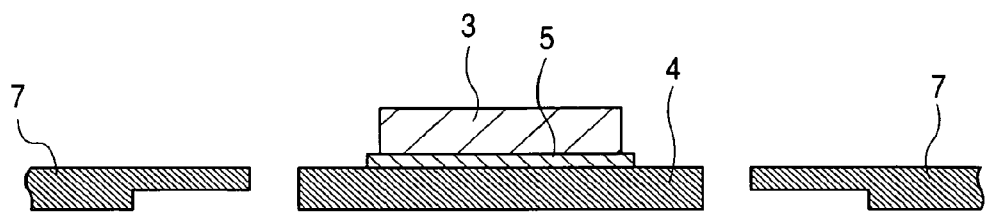
FIG. 9 is a schematic cross-sectional view showing the lead frame which mounts the semiconductor chip thereon.

After preparing such a lead frame 13, as shown in FIG. 8 and FIG. 9, the semiconductor chip 3 is fixed to the semiconductor element mounting portion 4a of the tab 4 of each unit lead frame patterns 14 by way of the adhesive agent 5 (chip bonding)(S102).

Figure 10:
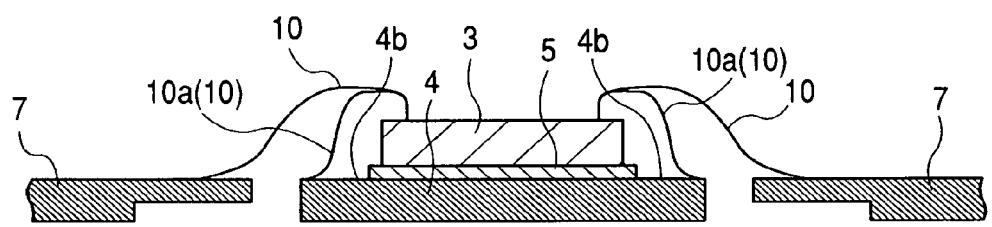
FIG. 10 is a schematic cross-sectional view showing the lead frame after the wire bonding is finished.
Figure 11:
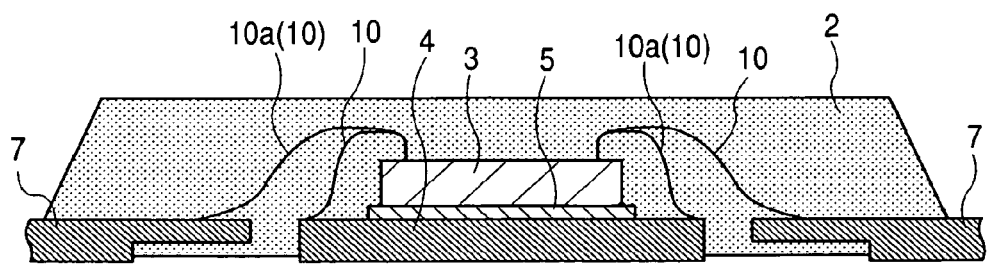
FIG. 11 is a schematic cross-sectional view showing the lead frame on which a sealing body is formed.

Next, as shown in FIG. 10, the wire bonding is performed so as to connect the electrode terminals of the semiconductor chip 3 and the distal ends of the leads 7 using the conductive wires 10 and, at the same time, so as to connect the given electrode terminals and the wire connecting region 4b of the tab 4 using the conductive wires 10 (S103). The wires which connect the electrode terminals and the wire connecting region 4b of the tab 4 are particularly referred to as down-bond wires 10a. The wires are made of gold lines, for example.

Next, the single-sided molding is performed using the usual transfer molding so as to form the sealing body 2 on the main surface of the lead frame 13 using the insulation resin (S104). The sealing body 2 covers the semiconductor chip 3, the lead 7 and the like formed over the main surface side of the lead frame 13. In FIG. 8, the portion which is indicated by the chain double-dashed line is the region where the sealing body 2 is formed.

Next, although not shown in the drawing, the plating treatment is performed (S105). As a result, a plating film not shown in the drawing is formed over the back surface of the lead frame 13. The plating film is used as a bonding material at the time of surface mounting of the semiconductor device 1 and is, for example, formed of a solder plating film. In place of forming the above-mentioned plating film, it may be possible to use a product which is formed by preliminarily forming Pd plating on the whole surface of the lead frame 13. Further, when the lead frame 13 to which the Pd plating is applied is used, it is possible to omit the plating step after the above-mentioned sealing and hence, the manufacturing steps can be simplified and the manufacturing cost can be reduced.

Next, the dispensable lead frame portions are cut and removed (S106) thus manufacturing the semiconductor device 1 shown in FIG. 1. Slightly outside the sealing body 2 in the chain double-dashed-line frame shown in FIG. 8, the leads 7 and the tab supporting leads 6 are cut using a cutting mold of a press machine not shown in the drawing. Due to the structure of the cutting mold, the leads 7 and the tab supporting leads 6 are cut at a position slightly away from the sealing body 2, the distance between the away-position and the sealing body 2 is set to 0.1 mm or less, for example. A projection length of the leads 7 and the tab supporting leads 6 from the sealing body 2 is preferably short to prevent the leads 7 and the tab supporting leads 6 from being caught by other parts. The projection length can be freely selected by changing the cutting mold of the press machine provided that the projection length is 0.1 mm or more.

Here, one example of sizes of respective portions of the semiconductor device 1 is exemplified.

A thickness of the lead frame 13 (tab 4, tab supporting leads 6, leads 7) is 0.2 mm, a thickness of the chip 3 is 0.28 mm, a thickness of the semiconductor device 1 is 11.0 mm, a width of the leads 7 is 0.2 mm, a length of the leads 7 is 0.5 mm, a distance between a wire connection portion (point) of the tab 4 and the end of the chip 3 mounted on the tab 4 is 0.1 mm, and a distance between the tab 4 and the lead 7 is 0.2 mm.

On the other hand, one of the features of the present invention lies in that a portion of the circuit in the inside of the semiconductor chip 3, the ground of the specified circuit part is taken out as a grounding electrode terminal and is connected to the leads by way of wires and are separated from the grounds of remaining circuit parts. The respective remaining circuit parts are connected with the tab which serves as the common ground by way of wires when necessary and, at the same time, may be connected with the leads by way of wires. Further, the ground of the specified circuit part and the grounds of other remaining circuit parts are, although not shown in the drawing, separated in an insulating manner by interlayer insulation films or the like even in the wiring inside the semiconductor chip 3.

With respect to the high frequency power module to which the present invention is applied in this embodiment, when all of circuit parts formed in the single semiconductor chip use the ground in common, as explained previously, a crosstalk is generated due to the fluctuation of the ground potential and this may lead to the generation of the fluctuation of outputs of the respective circuit parts and the distortion of the signal waveforms. Further, with respect to the high frequency power module which has a plurality of communication circuits such as the dual bands or the triple bands, an induced current is generated in the communication circuit which is not operated and there exists a possibility that this induced current intrudes into the communication circuit which is operated as noises. Accordingly, in this embodiment 1, the electrode terminal for grounding (grounding electrode terminal) of the specific circuit part is not connected to the tab and is connected to the independent lead (grounding lead) by way of wires.

Further, also due to the crosstalk between the input signal lines, there exists a possibility of the occurrence of the fluctuation of outputs in the respective circuit parts and the distortion of the signal waveforms. Particularly, with respect to the lead for inputting the external signal from the antenna having the small input signal, it is necessary to avoid the influence of the crosstalk with the neighboring lead as much as possible.

In this embodiment 1, since the semiconductor device 1 is the high frequency power module for triple bands of the mobile phone, the specified circuit part is a low noise amplifier (LNA). Since the high frequency power module is for triple bands, as the low noise amplifiers (LNA) which are connected with the antenna, three low noise amplifiers (LNA) are arranged.

Figure 5:
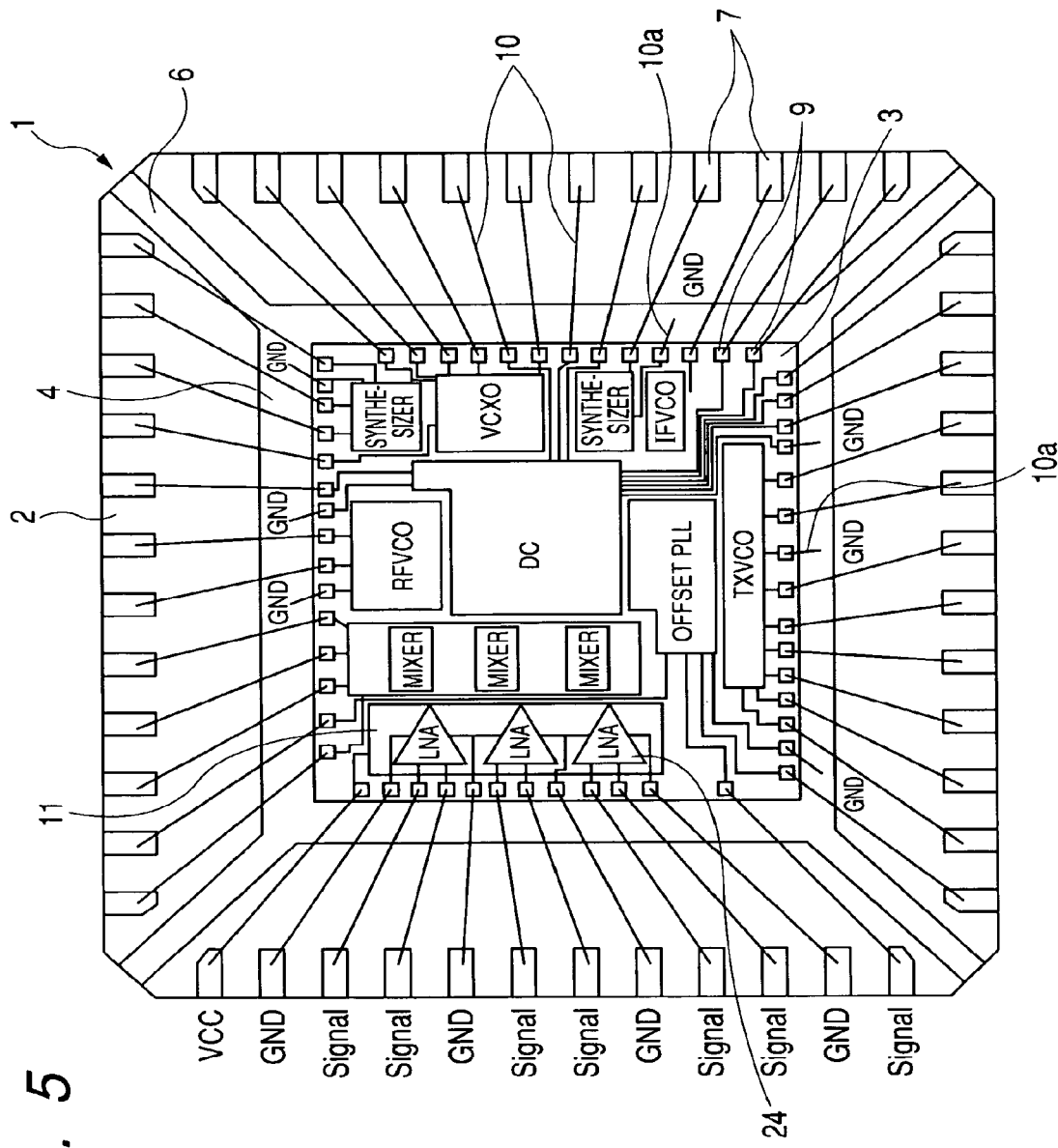
FIG. 5 is a schematic plan view showing a state of wire connection between external electrode terminals and respective circuit parts of the semiconductor chip such as a low noise amplifier, a synthesizer and the like in the high frequency power module of the embodiment 1.
Figure 6:
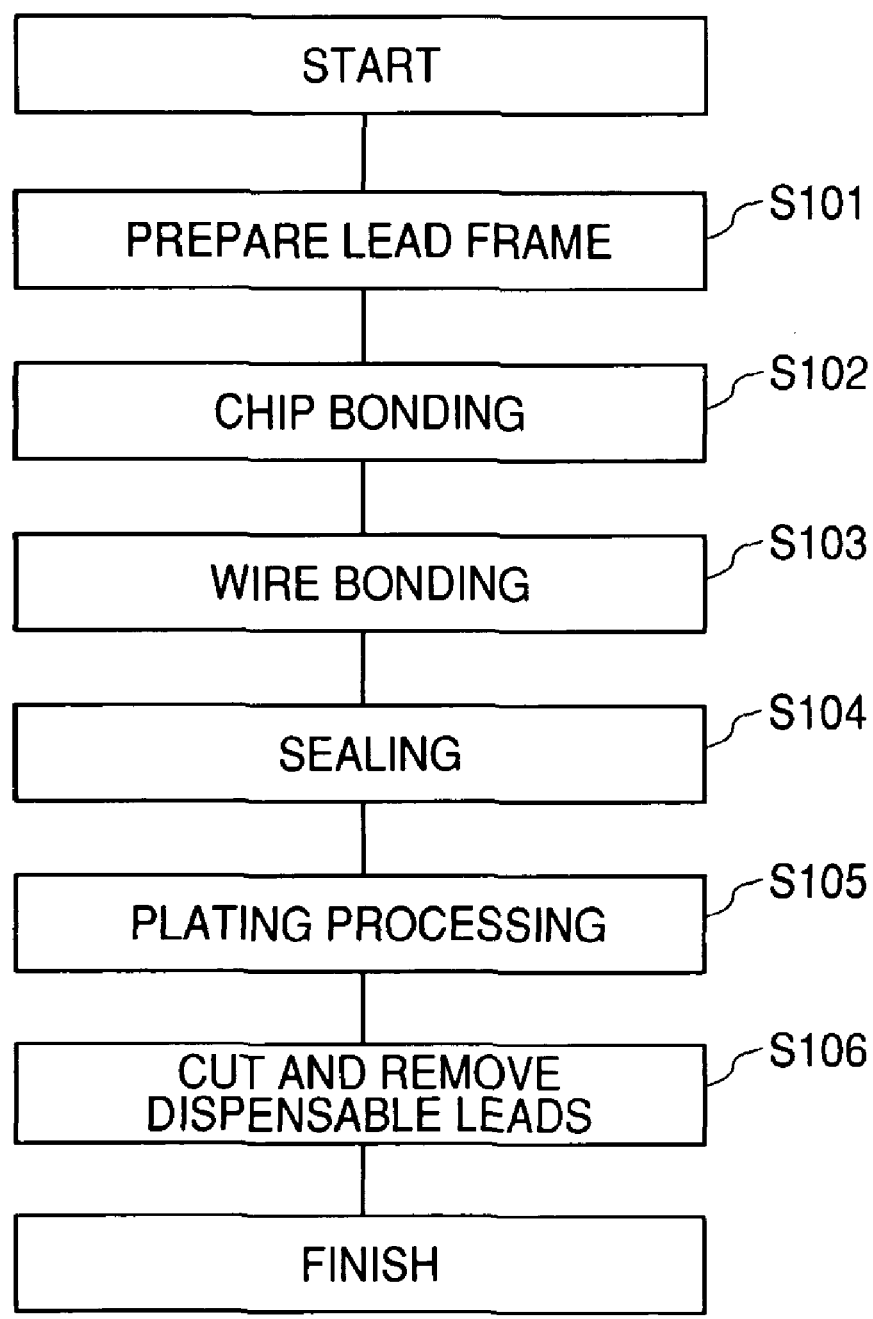
FIG. 6 is a flow chart showing a manufacturing method of the high frequency power module of the embodiment 1.

The single LNA means the specified circuit part of the present invention in a narrow definition of the term. That is, as shown in FIG. 5, the input signal lines from the antenna of each LNA are provided two. Further, to perform the electromagnetic shielding of these two signal lines, the leads for grounding are arranged between two leads for signals and another lead for signals, preferably at both sides of two leads of signals.

By adopting the differential inputting constitution while using two input signal lines, two input signal lines receive the substantially equal amount of the influence attributed to the crosstalk at the same level and hence, it is possible to offset (cancel) the noise (crosstalk). Here, as shown in FIG. 5, the rectangular frame portion which surrounds three LNA is set as the specified circuit part 11 in the broad definition. In this specified circuit part 11, the respective LNAs are formed in the regions which are separated from other circuit parts in an insulating manner in the semiconductor chip. Then, the respective LNAs use the common ground potential. This is because that, in the dual communication system and the triple communication system, when one communication system is being used, the remaining communication system is in the idling state and hence, the influence to the ground potential from the LNA which belongs to the communication system now under the idling state is small whereby even when the grounding electrodes or the ground lines for LNA which belong to the respectively different communication systems are used in common, the adverse influence that the respective LNA affect each other is small. However, when necessary, it is possible to adopt the constitution in which the isolation may be applied to every LNA so as to make the ground potential of the respective LNA independent from each other.

FIG. 13 is a schematic cross-sectional view showing a mounting state of the semiconductor device (high frequency power module) 1 of the embodiment 1 in a mobile phone.

On the main surface of the mounting board (printed circuit board) 80 of the mobile phone, for mounting the semiconductor device 1, a land 81 and a tab fixing portion 82 which are contiguously formed with the wires corresponding to the leads 7 and the tab 4 of the semiconductor device 1 are formed. Here, the semiconductor device 1 is positioned and placed on the mounting board 80 such that the leads 7 and the tab 4 of the semiconductor device 1 correspond to and are overlapped to the land 81 and the fixing portion 82. Then, in such a state, a solder plating film which is preliminarily formed over a back surface of the leads 7 and the tab 4 of the semiconductor device 1 is temporarily made to reflow so as to connect (mount) the leads 7 and the tab 4 with a solder 83.

Here, the circuit constitution (functional constitution) of the mobile phone having the triple band constitution is briefly explained in conjunction with FIG. 12. That is, the mobile phone can perform the signal processing of, for example, the GSM communication method of 900 MHz band, the DCS1800 communication method of 1800 MHz band and the PCS1900 communication method of 1900 MHz band.

In the block diagram shown in FIG. 12, a transmission system and a reception system which are connected with an antenna 20 using an antenna switch 21 are shown, wherein the both of the transmission system and the reception system are connected to a base band chip 22.

The reception system includes the antenna 20, the antenna switch 21, three band pass filters 23 which are connected in parallel to the antenna switch 21, low noise amplifiers (LNA) 24 which are connected to the respective band pass filters 23, and variable amplifiers 25 which are connected to three LNA 24 and are connected with each other in parallel. To each one of these two variable amplifiers 25, a mixer 26, a low pass filter 27, a PGA 28, a low pass filter 29, a PGA 30, a low pass filter 31, a PGA 32, a low pass filter 33, and a modulator 34 are connected. The PGA 28, the PGA 30 and the PGA 32 are respectively controlled by a control logic circuit part 35 for ADC/DAC&DC offset. Further, two mixers 26 are subjected to a phase control of a 90-degree phase shifter (90-degree phase shifter) 40.

In FIG. 12, I/Q modulators each of which is comprised of the 90-degree phase shifter 40 and two mixers 26 are provided corresponding to three LNA to cope with the respective bands. However, for the sake of brevity, only one I/Q modulator is shown in FIG. 12.

The semiconductor chip 3 is provided with a synthesizer which is comprised of an RF synthesizer 41 and an IF (intermediate) synthesizer 42 as signal processing ICs. The RF synthesizer 41 is connected with a RFVCO 44 through a buffer 43 and performs a control such that the RFVCO 44 outputs an RF local signal. Two frequency dividers 37, 38 for local signals are connected to the buffer 43 in series and switches 48, 49 are connected to respective output ends of the frequency dividers 37, 38. The RF local signal transmitted from the RFVCO 44 is inputted to the 90-degree phase converter 40 by the changeover of the switch 48. In response to the RF local signal, the 90-degree phase converter 40 controls the mixer 26.

The signal output mode of the RFVCO 44 is, in case of an Rx mode, 3780 to 3840 MHz for GSM, 3610 to 3760 MHz for DCS and 3860 to 3980 MHz for PCS. Further, the signal output mode of the RFVCO 44 is, in a Tx mode, 3840 to 3980 MHz for GSM, 3580 to 3730 MHz for DCS and 3860 to 3980 MHz for PCS.

The IF synthesizer 42 is connected with an IFVCO (intermediate wave voltage control oscillator) 45 through a frequency divider 46 and the IF synthesizer 42 performs a control such that the IFVCO 45 outputs an IF local signal. The frequency of the output signal from the IFVCO 45 is 640 MHz in all communication methods. Further, a VCXO (voltage control crystal oscillator) 50 is controlled by the RF synthesizer 41 and the IF synthesizer 42 to output the reference signal and the reference signal is transmitted to the base band chip 22.

With respect to the reception system, the IF signal is controlled by the synthesizer and the control logic circuit part 35 for ADC/DAC&DC offset and the IF signal is converted into base band chip signals (I, Q signals) by the modulator 34 and the base band chip signals are transmitted to the base band chip 22.

The transmission system includes two mixers 61 which uses the I/Q signals outputted from the base band chip 22 as input signals, a 90-degree phase shifter 62 which controls phases of these two mixers 61, an adder 63 which adds outputs of these two mixers 61, a mixer 64 and DPD (digital phase detector) 65 which receive an output of the adder 63 as inputs thereof, a loop filter 66 which receives outputs of the mixer 64 and the DPD 65 as an input thereof, two TXVCO (transmission wave voltage control oscillators) 67 which receive an output of the loop filter 66 as inputs thereof, a power module 68 which receives outputs of two TXVCO 67 as an input thereof, and the antenna switch 21. The loop filter 66 is an exteriorly mounted part.

A DC-AC modulator is comprised of the mixer 61, the 90-degree phase shifter 62 and the adder 63. The 90-degree phase shifter 62 is connected with the frequency divider 46 through a frequency divider 47 and is controlled in response to the IF local signal outputted from the IFVCO 45.

Outputs of two TXVCO 67 are detected by the detection of a current using a coupler 70. The detected signal is inputted to a mixer 72 through an amplifier 71. The mixer 72 receives the RF local signal outputted from the RFVCO 44 through the switch 49 as an input thereof. An output signal of the mixer 72 is inputted to the mixer 64 and the DPD 65 together with an output signal of the adder 63. An offset PLL (Phase-Locked Loop) is comprised of the mixer 64 and the DPD 65. The frequency of the output signal from the mixer 72 is 80 MHz in respective communication methods.

Out of two TXVCO 67, one TXVCO 67 adopts the GSM communication method, wherein the frequency of the output signal is 880 to 915 MHz. Further, another TXVCO 67 is for DCS and PCS communication methods, wherein frequency of the output signals are 1710 to 1785 MHz or 1850 to 1910 MHz. The power module 68 incorporates a low frequency power module and a high frequency power module therein, wherein the low frequency power module receives a signal from the TXVCO 67 which outputs the signal of 880 to 915 MHz and performs the amplifying processing, while the high frequency power module receives a signal from the TXVCO 67 which outputs a signal of 1710 to 1785 MHz or 1850 to 1910 MHz and performs the amplifying processing of the signal and transmits the signal to the antenna switch 21.

A logic circuit 60 is also formed in the semiconductor device 1 of this embodiment 1 in a monolithic manner and transmits an output signal thereof to the base band chip 22.

In the semiconductor device (high frequency power module) 1 of this embodiment 1, the respective circuit parts in a portion surrounded by a bold line in FIG. 12 are formed in a monolithic manner. Further, a portion corresponding to three LNA 24 serves as the specified circuit parts 11 of this embodiment 1 (see FIG. 4 and FIG. 5). Block plan views of the semiconductor chip 3 shown in FIG. 4 and FIG. 5 schematically show a portion of these respective circuit parts.

A radio signal (electric wave) which is received by the antenna 20 is converted into an electric signal and is sequentially processed by respective elements of the reception system and is transmitted to the base band chip 22. Further, an electric signal outputted from the base band chip 22 is sequentially processed by respective elements of the transmission system and is radiated from the antenna 20 as electric waves.

FIG. 4 is a schematic layout chart showing the arrangement of respective circuit parts in the semiconductor chip 3. On the main surface of the semiconductor chip 3, electrode terminals (pads) 9 are arranged along the sides. Further, in the inside of these electrode terminals 9, the respective circuit parts are arranged by dividing the region. As shown in FIG. 4, at the center of the semiconductor chip 3, the control logic circuit part 35 for ADC/DAC&DC offset is arranged. On the other hand, the mixers 26, 64 and three LNA 24 are arranged in parallel at the left side of the control logic circuit part 35, the RFVCO 44 is positioned at the upper side of the control logic circuit part 35, the RF synthesizer 41, the VCXO 50, the IF synthesizer 42 and the IFVCO 45 are arranged at the right side of the control logic circuit part 35 from an upper portion to a lower portion, and the TXVCO 67 is positioned at the lower side of the control logic circuit part 35.

FIG. 5 shows the relationship between the respective circuit parts (the first circuit parts and the second circuit parts) and the electrode terminals 9 and the wire connection state of the electrode terminals 9 and the leads 7 using the wires 10. As the wires 10, the wires 10 which connect the electrode terminals 9 and the leads 7 and the down-bond wires 10a which connect the electrode terminals 9 and the tab 4.

To focus on three LNA 24 which are the specified circuit parts 11 (the first circuit parts), the leads 7 which are expected to be connected with the band pass filter 23 which is an exteriorly mounted part, that is, the leads 7 on which "Signal" is described on the left side thereof and the signal electrode terminals 9 of the LNA 24 are connected through the wires 10. Two signal lines which reach the lead 7 from the electrode terminals 9 through the wires 10 are provided. At both sides of these signal lines, the ground electrode terminals 9 of the LNA 24 which is the specified circuit parts 11 are connected to the grounding lead 7 (the lead 7 which is described as GND at the left side in the drawing) through the wires 10 thus forming the ground lines.

Due to such a constitution, the specified circuit part 11 is separated in an insulating manner from other circuit parts. That is, at least the grounding of respective VCO and the grounding of the LNA 24 are separated in an insulating manner and, at the same time, the space between the lead of the neighboring other circuit part and the lead of the LNA 24 is electromagnetically shielded from the grounding lead 7. Further, the neighboring LNA 24 are also electromagnetically shielded by the grounding lead 7.

Compared to the LNA 24 which amplifies the extremely weak signal transmitted from the antenna, in the respective circuit parts of the transmission system (for example, the offset PLL, TXVCO 67 and the like) which process an electric signal outputted from the base band chip 22, the electric signal is large compared to the above-mentioned extremely weak signal and hence, the circuit parts of the transmission system have the characteristics that the circuit parts are stronger against the fluctuation of the ground potential and noises attributed to the cross talk. Accordingly, with respect to the supply of the ground potential to the circuit parts of the transmission system, by using the ground potential in common with the respective VCO through the tab 4, the number of the leads 7 can be reduced so that the semiconductor device can be miniaturized.

It is preferable to arrange the LNA closer to the electrode terminals 9 for preventing the deterioration of the signal attributed to the cross talk between the lines formed over the main surface of the semiconductor chip 3. For example, compared to the circuit which handles signals amplified by the LNA, for example, PGA or the like or circuits of the transmission system, to shorten the length of wiring of the LNA, it is preferable to arrange the LNA closer to the electrode terminal 9.

According to the embodiment 1, it is possible to obtain following advantageous effects.

(1) In the semiconductor device 1, that is, the high frequency power module 1, the electrode terminals 9 of the semiconductor element (semiconductor chip) 3 are not only connected with the leads 7 through the wires 10 but also to the tab 4 (down-bonding). Here, since in this down-bonding, the tab 4 becomes the common ground, the grounding electrode terminal of the low noise amplifier 24 which is the specific circuit part 11 (electrode terminal of the semiconductor element) is not connected to the tab 4 and is connected to the independent lead terminal (grounding lead). Since the low noise amplifier 24 amplifies the extremely weak signal, the fluctuation of the ground potential becomes the fluctuation of the output of the low noise amplifier 24 and, at the same time, the signal waveform is also distorted. However, the grounding of the low noise amplifier 24 is separated from the grounds of other circuit parts and hence, it is possible to suppress the fluctuation of the output of the low noise amplifier 24 and the distortion of the signal waveforms. As a result, by incorporating the high frequency power module into the radio communication device, it is possible to provide the favorable calls without the fluctuation of outputs and the distortion.

(2) In the high frequency power module which includes a plurality of communication circuits, when the high frequency power module adopts the common ground using the tab 4, along with the fluctuation of the ground potential, an induced current is generated in the communication circuit which is not used and hence, a so-called cross talk in which noises attributed to the induced current intrudes into the communication circuit in use (under operation) is generated. However, in the high frequency power module 1 of the present invention, since the low noise amplifiers 24 of the respective communication circuits are separated from the grounds of other circuit parts, it is possible to suppress the fluctuation of the output of the low noise amplifier 24 and the distortion of the signal waveforms. As a result, also in the radio communication device having a plurality of communication circuits, it is possible to provide the favorable calls without the fluctuation of the output and free from the distortion.

(3) In the high-frequency power module 1, the ground lines are arranged at both sides of the signal line which reaches the lead 7 from the electrode terminal 9 of the low noise amplifier 24 through the wire 10 thus magnetically shielding the signal line and hence, the signal line hardly receives the cross talk.

(4) In the high frequency power module 1, the tab 4 is exposed on the back surface of the sealing body 2 and hence, it is possible to effectively dissipate the heat generated in the semiconductor chip 3 to the mounting board 80. Accordingly, the radio communication device which incorporates the high frequency power module 1 therein can ensure the stable operation thereof.

(5) Since the high frequency power module 1 is non-lead type semiconductor device which exposes the tab 4 and the leads 7 on the back surface of the sealing body 2 and hence, it is possible to achieve the miniaturization and the reduction of the thickness of the high frequency power module 1 and hence, the high frequency power module 1 can become also light-weighted. Accordingly, it is also possible to achieve the miniaturization and the reduction of the weight of the radio communication device in which the high frequency power module 1 is incorporated.

(6) In the high frequency power module 1, the electrode terminals 9 of the semiconductor chip 3 and the leads (pins) 7 are connected with each other using the wires 10 and at the same time, the tab 4 which assumes the ground potential and the electrode terminals (grounding electrode terminals) of the semiconductor chip 3 are connected with each other using down-bond wires 10a thus providing the down-bonding structure. Accordingly, the number of grounding leads which become the external electrode terminals 7 can be reduced, and hence, the miniaturization of the sealing body 2 attributed to the reduction of the number of pins can be realized whereby the miniaturization of the high frequency power module 1 can be achieved.

Embodiment 2

Figure 14:
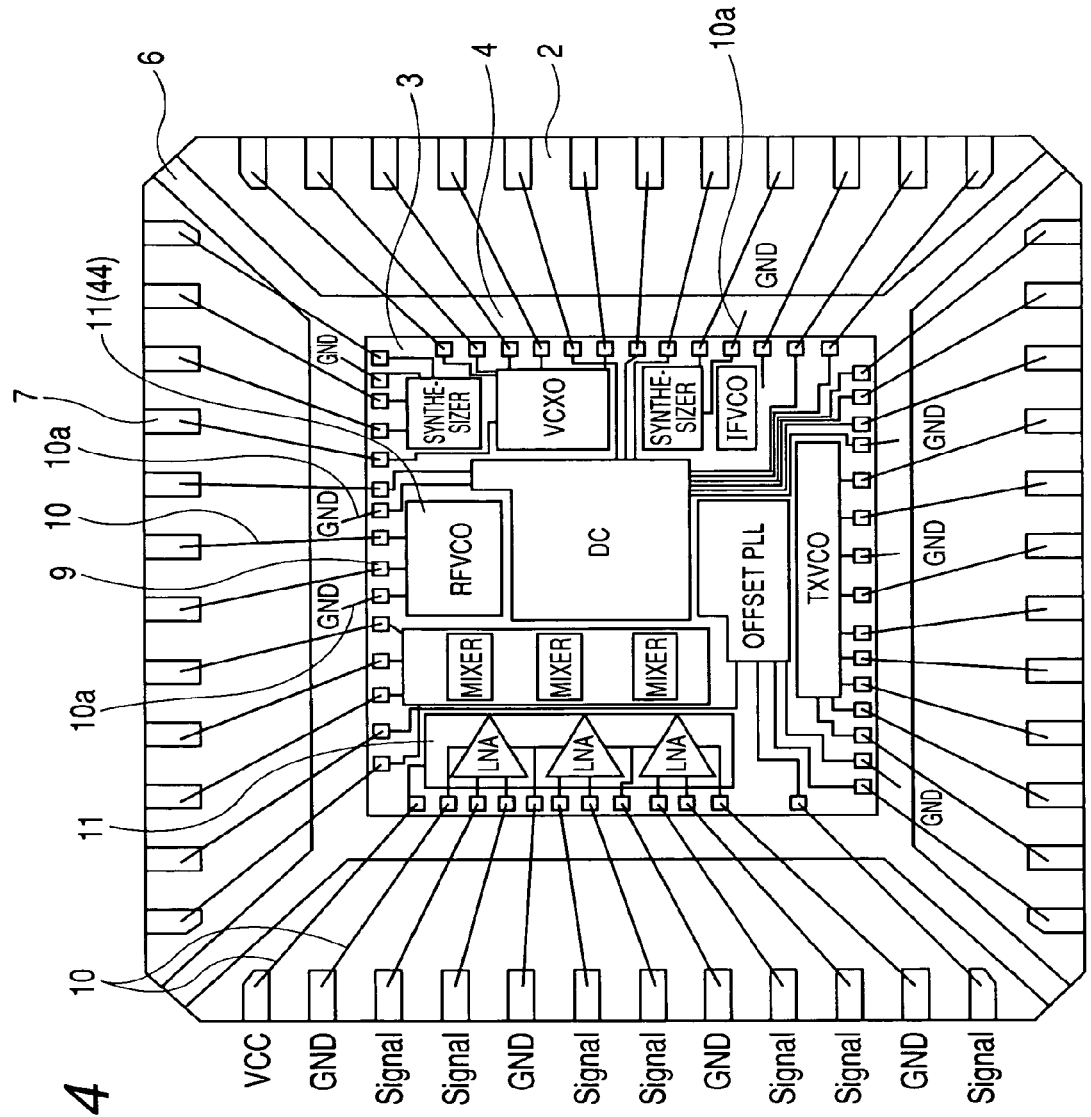
FIG. 14 is a schematic plan view of a high frequency power module of another embodiment (embodiment 2) of the present invention in a state that a portion of a sealing body is cut away.

FIG. 14 is a schematic plan view of a high frequency power module of another embodiment (embodiment 2) of the present invention in a state that a portion of a sealing body is cut away.

In the embodiment 1, the circuit parts include three low noise amplifiers (LNA) 24 as the specific circuit parts 11. In this embodiment 2, besides the above-mentioned circuit parts, among the VCO, the RFVCO 44 which treats the high frequency is also used as the specific circuit part 11. Accordingly, all the grounding electrode terminals 9 of the RFVCO 44 are connected to the leads (ground leads) 7 through the wires 10, while the ground electrode terminals 9 are not connected with the tab 4 through the wires.

With respect to the lines which reach the leads 7 from the electrode terminals 9 of the semiconductor chip 3 through the wires 10, the ground lines are arranged at both sides of two signal lines of the RFVCO 44 and hence, the electromagnetic shielding of the signal lines is provided.

Accordingly, the ground potential of the specific circuit parts 11 which treat the high frequency signal is separated from the ground potential of other circuit parts in an insulating manner whereby the cross talk is no more generated.

Embodiment 3

Figure 15:
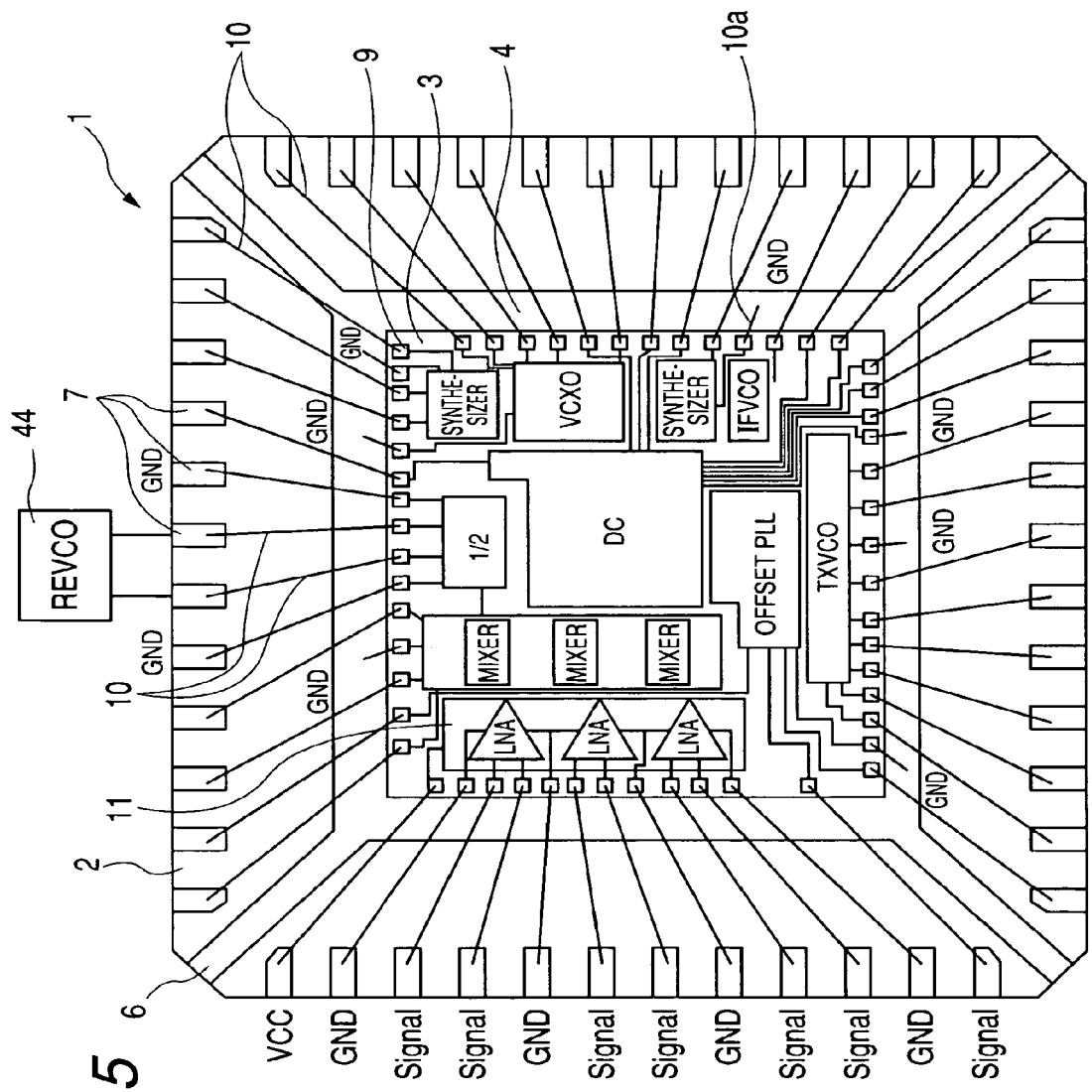
FIG. 15 is a schematic plan view of a high frequency power module of another embodiment (embodiment 3) of the present invention in a state that a portion of a sealing body is cut away.

FIG. 15 is a schematic plan view of a high frequency power module of another embodiment (embodiment 3) of the present invention in a state that a portion of a sealing body is cut away.

This embodiment 3 is directed to an example in which the RFVCO 44 is provided as an exteriorly mounted part and hence, the semiconductor chip 3 is not formed in a monolithic manner. In this dual band communication method, the respective circuit parts such as the low noise amplifier, the mixer, the VCO, the synthesizer, the IQ modulator/demodulator, the frequency divider, the DC-AC modulator and the like are formed in a monolithic manner.

Two mixers in the reception system are respectively controlled by the frequency divider, and the frequency divider is a frequency converting circuit for converting the high frequency signal outputted from the RFVCO 44 which is the exteriorly mounted part into the low frequency signal.

Accordingly, in this embodiment 3, as shown in FIG. 15, the RFVCO 44 is provided outside the semiconductor device 1 and two signal lines of the RFVCO 44 are connected to the leads 7 of the semiconductor device 1. Further, the electrode terminals 9 which are arranged at both sides of two signal lines which reach the electrode terminals 9 of the semiconductor chip 3 from two leads 7 which are connected to the RFVCO 44 through the wires 10 and the leads 7 are connected with each other through the wires 10. The electrode terminals 9 which are arranged at both sides of these two signal lines are grounding electrode terminals and hence, the leads 7 which are connected with the grounding electrode terminals through the wires 10 also serve as the grounding leads. Accordingly, in the same manner as the embodiment 2, the signal lines which treat the high frequency signal are also electromagnetically shielded and, at the same time, the circuit part has the ground potential which is independent from the ground potential of other circuit parts in the semiconductor chip 3.

Also in this embodiment 3, in the same manner as the embodiment 2, troubles which are brought about by the fluctuation of the ground potential of the RFVCO 44 are no more generated.

Embodiment 4

Figure 16:
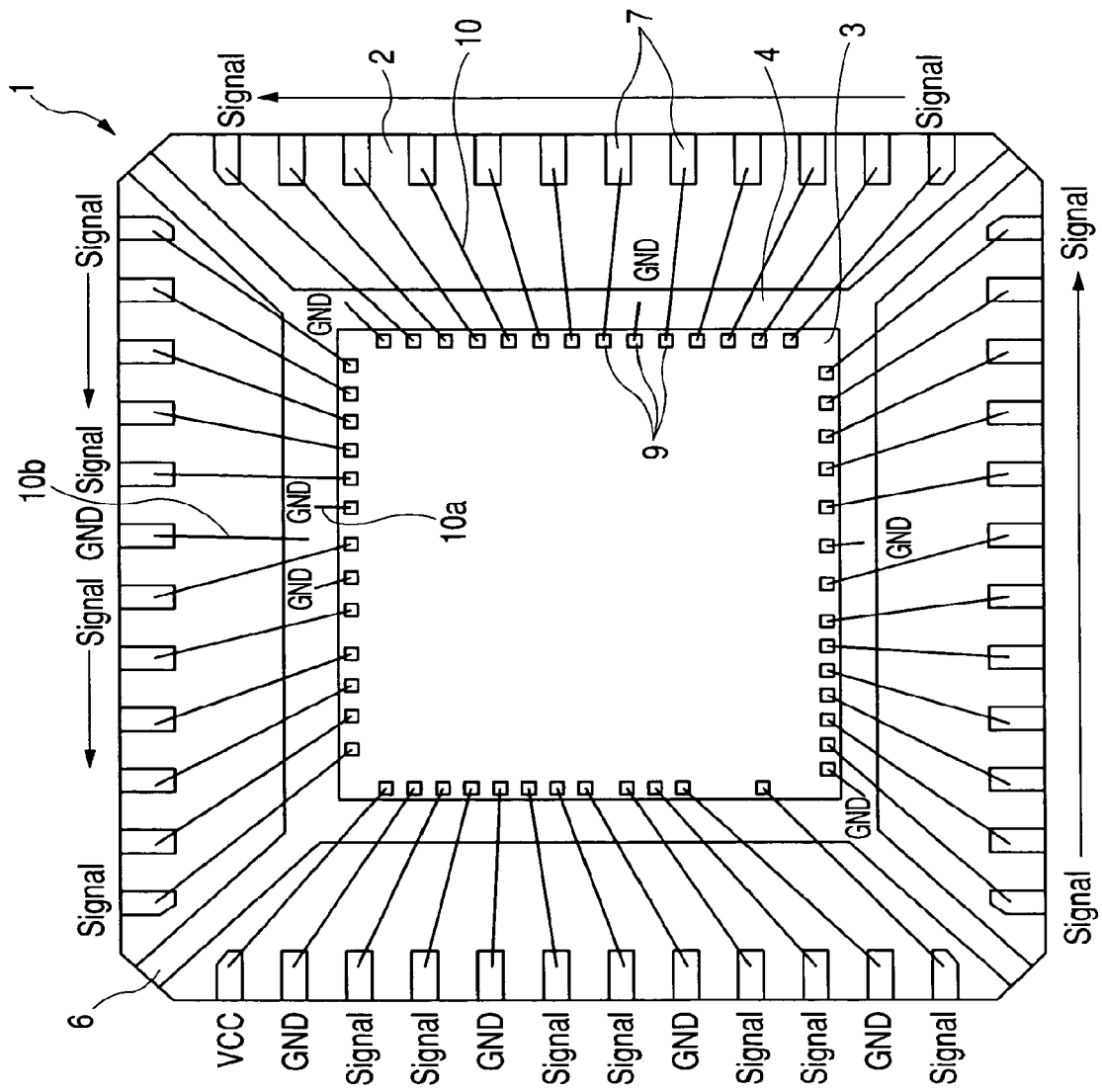
FIG. 16 is a schematic plan view of a high frequency power module of another embodiment (embodiment 4) of the present invention in a state that a portion of a sealing body is cut away.
Figure 17:
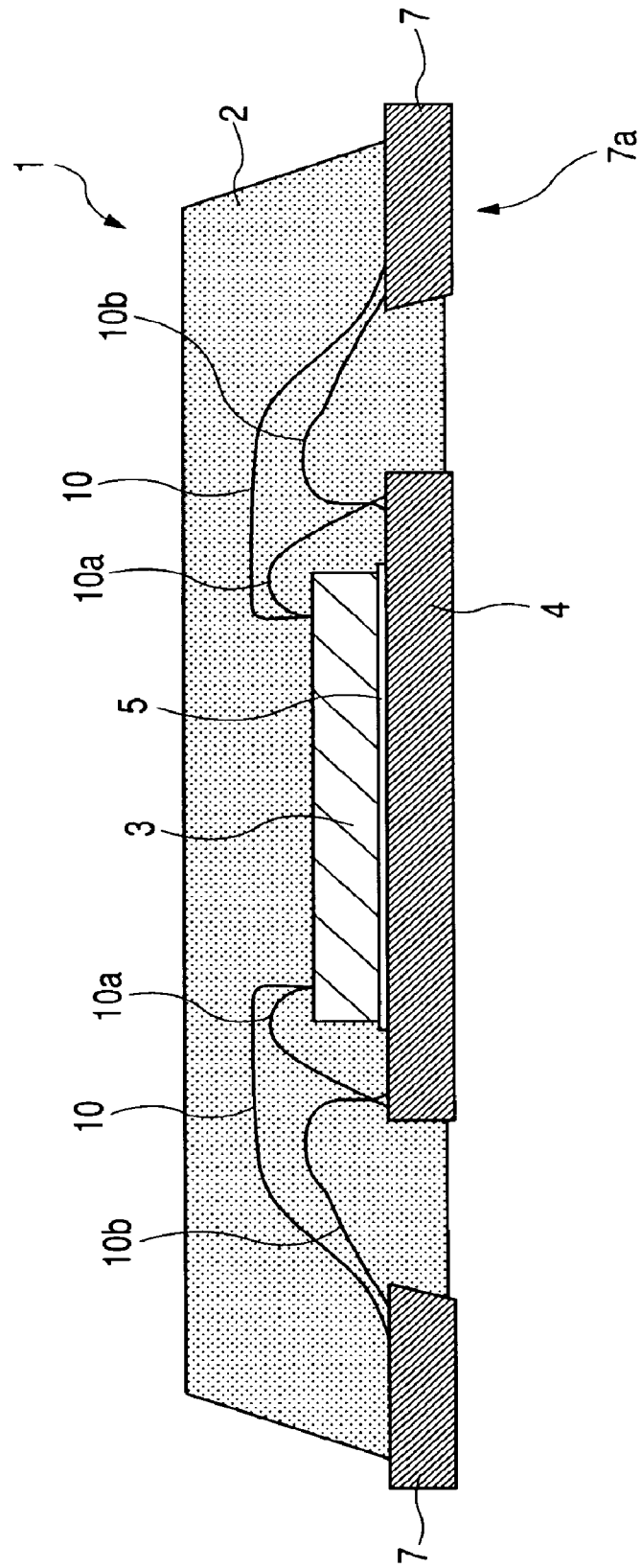
FIG. 17 is a schematic cross-sectional view of the high frequency power module of the embodiment 4.

FIG. 16 and FIG. 17 are views relating to the high frequency power module of another embodiment (embodiment 4) of the present invention, wherein FIG. 16 is a schematic plan view of the high frequency power module in which a portion of the sealing body is cut away and FIG. 17 is a schematic cross-sectional view of the high frequency power module.

This embodiment 4 is characterized in that the tab 4 which serves as the common ground terminal and the leads 7 which are made to assume the ground potential are electrically connected with each other using the conductive wires 10b, and the leads 7 also serve as ground external electrode terminals. In the semiconductor device 1 of this embodiment 4, since the back surface of the tab 4 is exposed from the back surface (mounting surface) of the sealing body 2, the tab 4 can be used as the ground external electrode terminal and, at the same time, the leads 7 which are connected to the tab 4 through the wires 10b are also used as the ground external electrode terminal.

Figure 18:
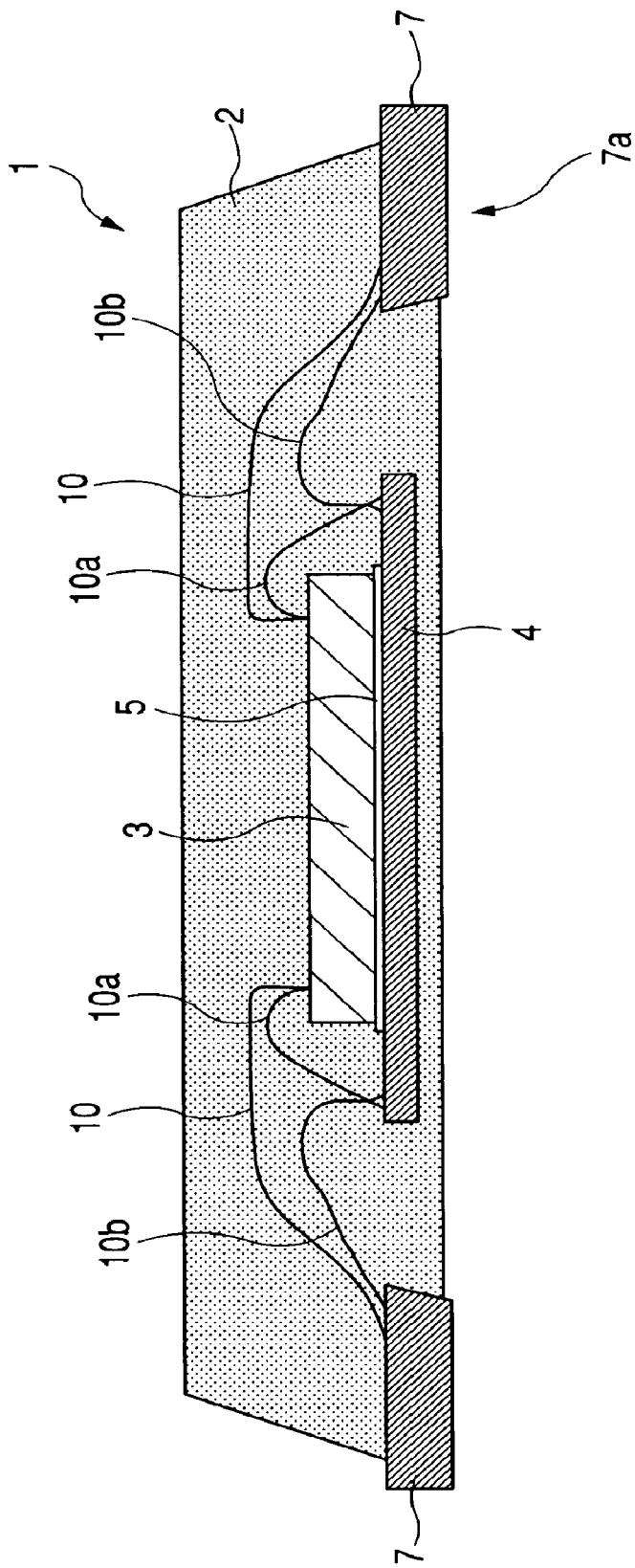
FIG. 18 is a schematic cross-sectional view showing a modification of the high frequency power module of the embodiment 4.

FIG. 18 is a modification of the embodiment 4. That is, in this modification, since the back surface side of the tab 4 is made thin by half etching, at the time of performing the single-sided molding, resin wraps around the back surface side of the tab 4. Accordingly, as shown in FIG. 18, the back surface of the tab 4 is also not exposed from the sealing body and is completely embedded in the inside of the sealing body 2. By adopting such a structure, since the tab 4 is connected with the leads 7 through the wires 10b, the leads 7 can be used as the ground external electrode terminals. Here, as another structure which embeds the tab into the sealing body, it may be possible to adopt the structure in which the tab suspending leads have midst portions thereof bent higher in a step-like manner by one step.

In the constitution described in FIG. 18, compared to the number of electrode terminals 9 for supplying ground potential which are connected to the tab 4 through the down-bond wires 10a, the number of leads 7 which are connected with the tab through the wires 10b can be reduced and hence, the number of leads 7 which are arranged along the periphery of the sealing body 2 can be also reduced. Accordingly, the device can be miniaturized. Since, the back surface of the tab 4 is covered with the sealing body 2, when the semiconductor device 1 of this embodiment is mounted on the printed wiring board, it is possible to make use of the region below the semiconductor device 1 also for arranging the lines above the wiring printed circuit board. Accordingly, in this embodiment, it is possible to have an advantageous effect that the mounting density of the printed wiring board can be enhanced along with the miniaturization of the semiconductor device 1.

Embodiment 5

FIG. 19 to FIG. 30 are views relating to a high frequency power module (semiconductor device) according to another embodiment (embodiment 5) of the present invention. The high frequency power module according to the embodiment 5 is substantially equal to the high frequency power module of the embodiment 1.

Figure 30:
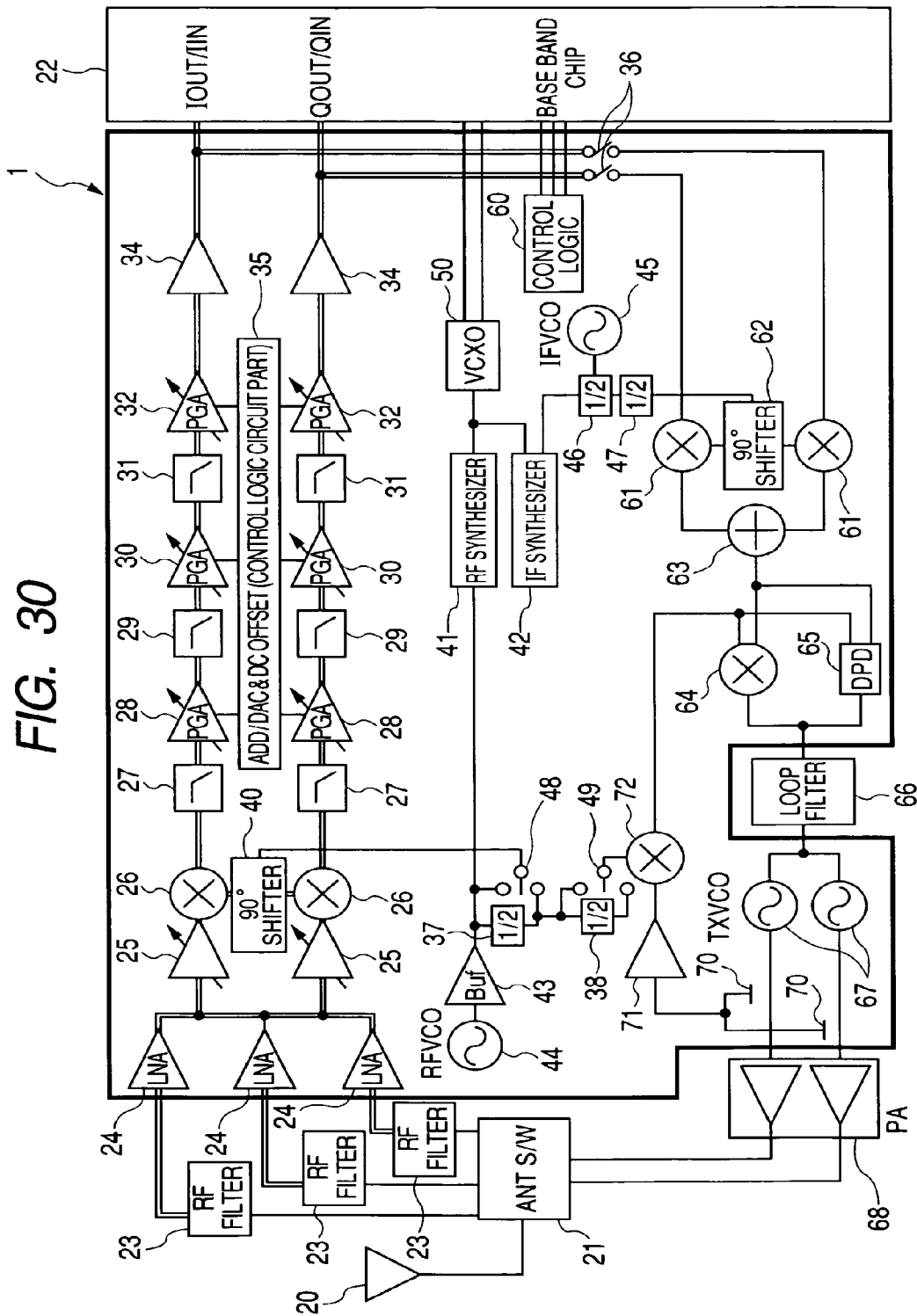
FIG. 30 is a block diagram showing the circuit constitution of a mobile phone in which the high frequency power module of the embodiment 5 is incorporated.

The high frequency power module 1 according to the embodiment 5 is, as shown in FIG. 30, used in a state that the high frequency power module 1 is incorporated in a radio communication device (portable radio equipment such as a mobile phone or the like) having a triple-band constitution (GSM communication, DCS communication and PCS communication) FIG. 30 substantially corresponds to FIG. 12 and shows a circuit constitution having a transmission/reception system from an antenna 20 to a base band 22. In the embodiment 5, complementary signals having a pair of phases which are inverted from each other are outputted from a band pass filter 23 connected to the antenna switch 21 to which the antenna 20 is connected, and this complementary signals are inputted into a low noise amplifier (LNA) 24 having two input/two output constitution. Then, the output signals of the LNA 24 are sequentially processed in respective circuit parts and are transmitted to the base band 22 or the transmission/reception changeover switch 36.

The substantial difference between the constitution shown in FIG. 30 and the constitution shown in FIG. 12 lies in that, in FIG. 30, to show that the signals are derived from the complementary signal processing, the number of the connection lines which connect respective circuit parts is set to two and the number of the output signal lines from a 90-degree phase shifter 40 to a mixer 26 is also set to two.

The high frequency power module 1 according to the embodiment 5, as shown in FIG. 19 to FIG. 22, assumes a non-lead type semiconductor device which exposes surfaces (lower surfaces: mounting surfaces 7a) of the leads 7 from the back surface of the sealing body (resin sealing body) 2 and has a QFN structure in which the leads 7 are respectively projected from four sides of the quadrangular shape. The chip mounting portion (tab) 4, the tab suspending leads 6 and the leads 7 are formed by patterning using a press or etching of a sheet of metal plate (for example, cupper plate) having a fixed thickness (for example, approximately 0.2 mm). Further, the lower surfaces (back surfaces) of the leads 7 or the tab suspending leads 6 are partially made thin by a fixed thickness (for example, approximately 0.1 mm) by etching. Further, the lead width is, for example, 0.2 mm in the first portions 7c and, for example, 0.15 mm in the second portion 7d. Accordingly, the upper surface of the chip mounting portion 4 which mounts the semiconductor chip 3, the upper surface of the lead 7 and the upper surface of the tab suspending lead 6 are positioned on the same plane and, at the same time, from the lower surface of the resin sealing body 2, the lower surface of the chip mounting portion 4 is exposed and portions of the leads 7 and the tab suspending leads 6 are exposed.

The resin sealing body 2 has a flat rectangular structure having an upper surface, a back surface (lower surface which faces the upper surface in an opposed manner) and side surfaces which are sandwiched between the above-mentioned upper surface and back surface. Then along a periphery of the resin sealing body 2, a plurality of leads 7 are provided in a state that the leads 7 extend over to the inside and the outside of the resin sealing body 2. The profile size of the high frequency power module 1 is equal to the profile size of the high frequency power module 1 described in the embodiment 1.

Figure 22:
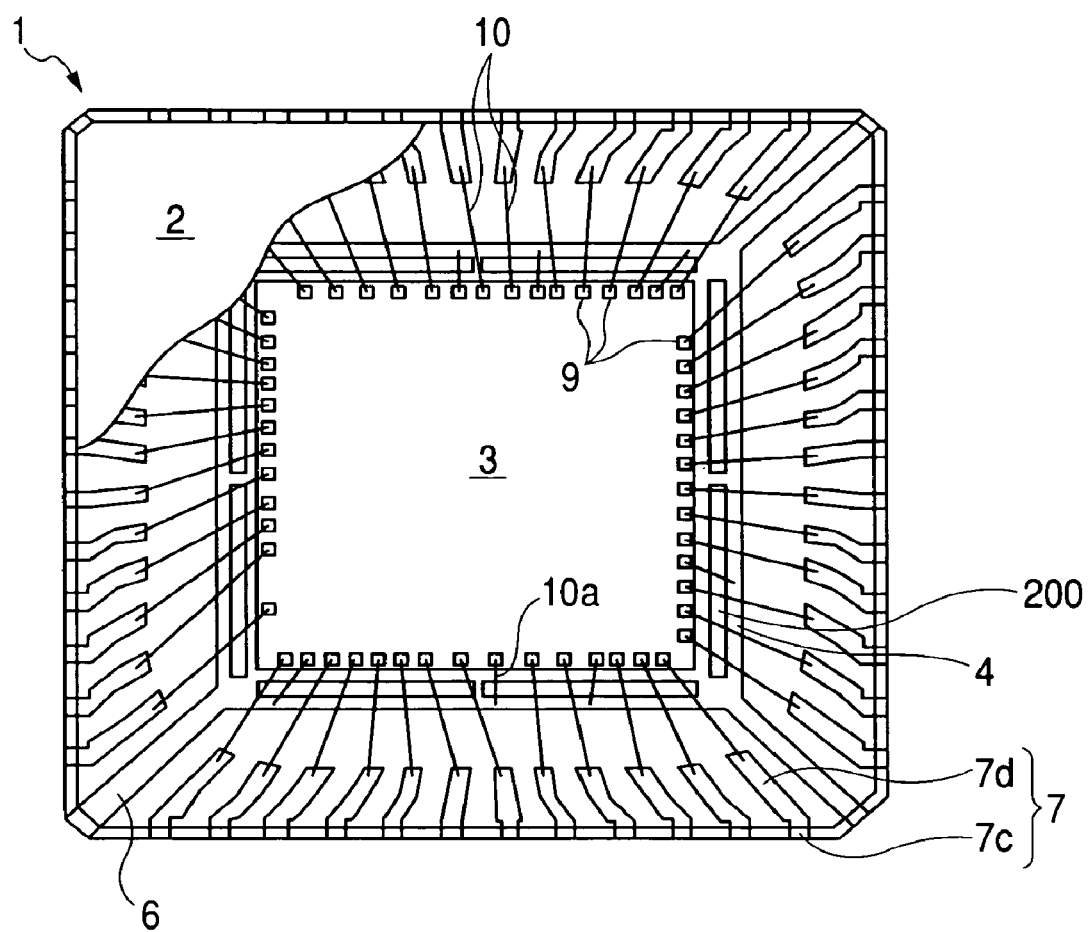
FIG. 22, is a plan view of the high frequency power module of the embodiment 5 in a state that a portion of a sealing body is cut away.

The chip mounting portion 4 has the following structure as shown in FIG. 22. That is, the chip mounting portion 4 is positioned in a region surrounded by the plurality of leads 7 and, onto this chip mounting portion 4, a semiconductor chip 3 is fixed by way of an adhesive agent 5. The planar shape of the semiconductor chip 3 is a quadrangular shape and a plurality of electrode terminals 9 and a plurality of circuit parts each of which includes a plurality of semiconductor elements are formed over the main surface of the semiconductor chip 3.

The semiconductor chip 3 is fixed to a quadrangular region surrounded by slits 200 which are formed along the periphery of the chip mounting portion (tab) 4. The chip mounting portion 4 is fixed to a ground potential. Further, although the chip mounting portion 4 and given electrode terminals 9 (ground potential electrode terminal) of the semiconductor chip 3 are connected with each other by conductive wires 10. These wires 10, that is, the down-bond wires 10a are connected to the chip mounting portion outside the slits 200. Since the down-bond wires 10a are connected to the chip mounting portion outside the slits 200, the chip mounting portion outside the slits 200 is not contaminated by the adhesive agent 5 which flows out and hence, the down-bond wires 10a obtain the favorable connection property. Further, due to the presence of the slits 200, a resin forming the resin sealing body 2 intrudes into the slits 200 and hence, the bonding strengths of the chip mounting portion 4 and the resin sealing body 2 are increased and the packaging property is enhanced. Further, due to the presence of the slits 200, the heat resistance at the time of mounting and heating is enhanced, and a so-called wire-peeling-off prevention effect at the tab bonding portions in the down-bonding can be obtained.

Figure 25:
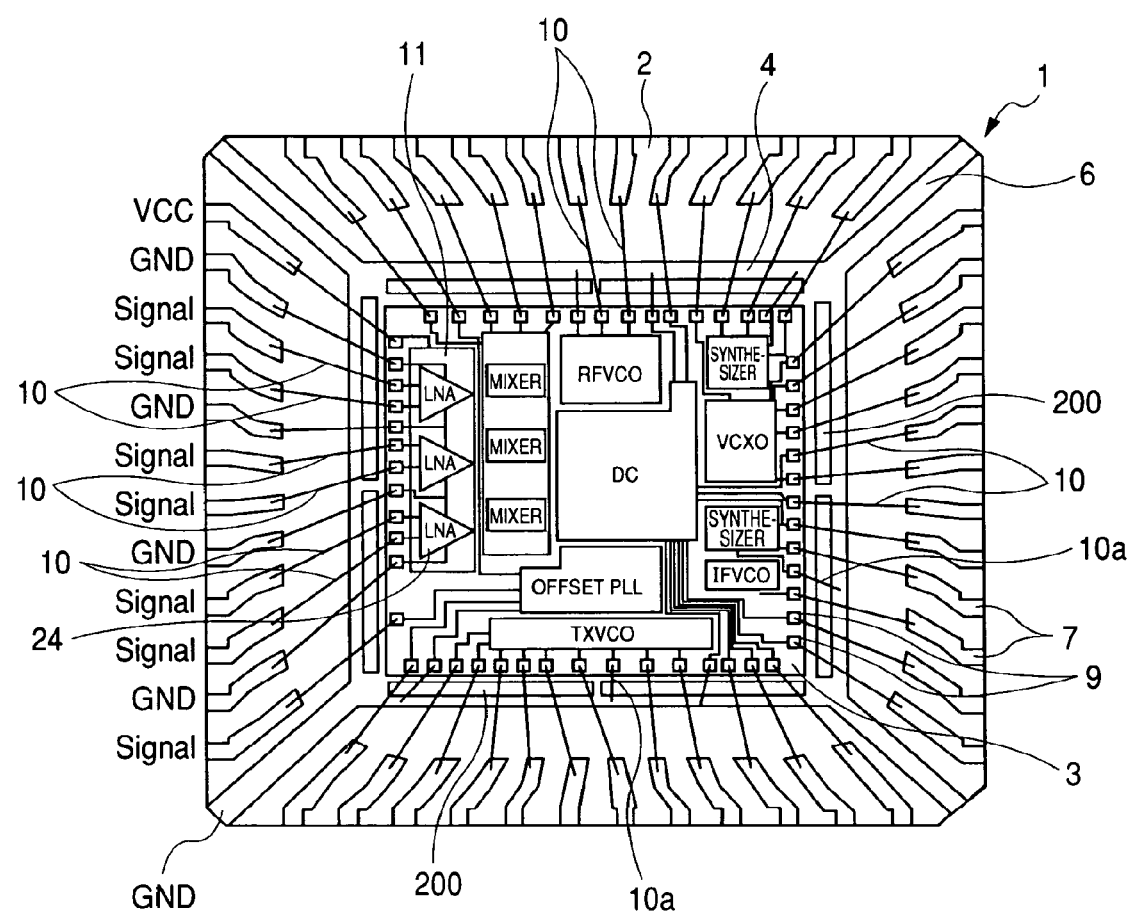
FIG. 25 is a schematic plan view showing a state of wire connection between external electrode terminals and respective circuit parts of the semiconductor chip such as a low noise amplifier, a synthesizer and the like in the high frequency power module of the embodiment 5.

A plurality of circuit parts of the semiconductor chip 3 include differential amplifiers (differential amplifying circuit parts) having a pair of inputs. In this differential amplifying circuit parts, as shown in FIG. 25, the low noise amplifier (LNA) 24 is formed. As shown in FIG. 25, with respect to a specified circuit part 11 which surrounds three LNA, in a region which is insulated and separated from other circuit parts in the semiconductor chip, respective LNA are formed. Then, the respective LNA use the common ground level. The constitution of this part is substantially equal to the constitution described in the embodiment 1.

Each LNA 24 is a circuit part provided for amplifying an electric signal which is converted by way of the antenna in the portable radio equipment. Since each LNA 24 according to the embodiment 5 forms a differential amplifier, the LNA includes two electrode terminals 9 for input wiring. The lengths of the wires 10 which are connected to these two electrode terminals 9 are set to the equal length to ensure the pair characteristics of the input signals of the differential amplifying circuit part. Further, on both sides of the wires 10 which connect these two electrode terminals 9 and the leads 7 corresponding to the electrode terminals 9, the wires 10 for grounding are arranged and, electromagnetic shielding is applied to the signal lines so as to prevent the generation of crosstalk.

Next, the input wirings (signal lines) of the differential amplifying circuit part is further explained including patterns of the leads 7 or the like. The plurality of electrode terminals 9 of the semiconductor chip 3 include, as shown in FIG. 23A, a first electrode terminals 9a and a second electrode terminals 9b corresponding to a pair of inputs of the differential amplifying circuit part. The first electrode terminals 9a and the second electrode terminals 9b are arranged close to each other along a side of the semiconductor chip 3. Into the first electrode terminals 9a and the second electrode terminals 9b, a pair of complementary signals having different phases (phases being inverted from each other) is inputted. To obtain the simultaneous inputting characteristics (pair characteristics) of the input signals (complementary signals), the lengths of the wires 10 which are connected to the first electrode terminals 9a and the second electrode terminals 9b are set to the equal length.

To set the lengths of the wires 10 to the equal length, the planar pattern of the leads 7 is changed so as to make the distances between the leads 7 and given electrode terminals 9 equal.

Figure 19:
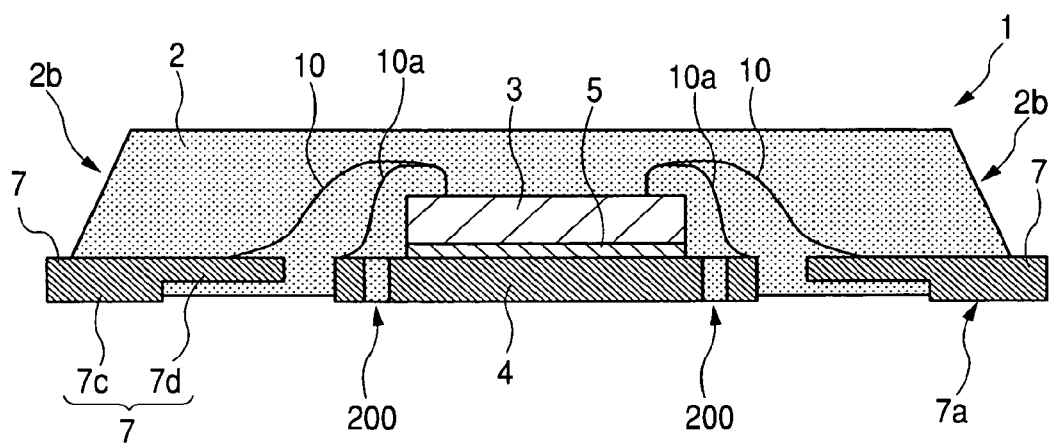
FIG. 19 is a schematic cross-sectional view of a high frequency power module of another embodiment (embodiment 5) of the present invention.
Figure 20:
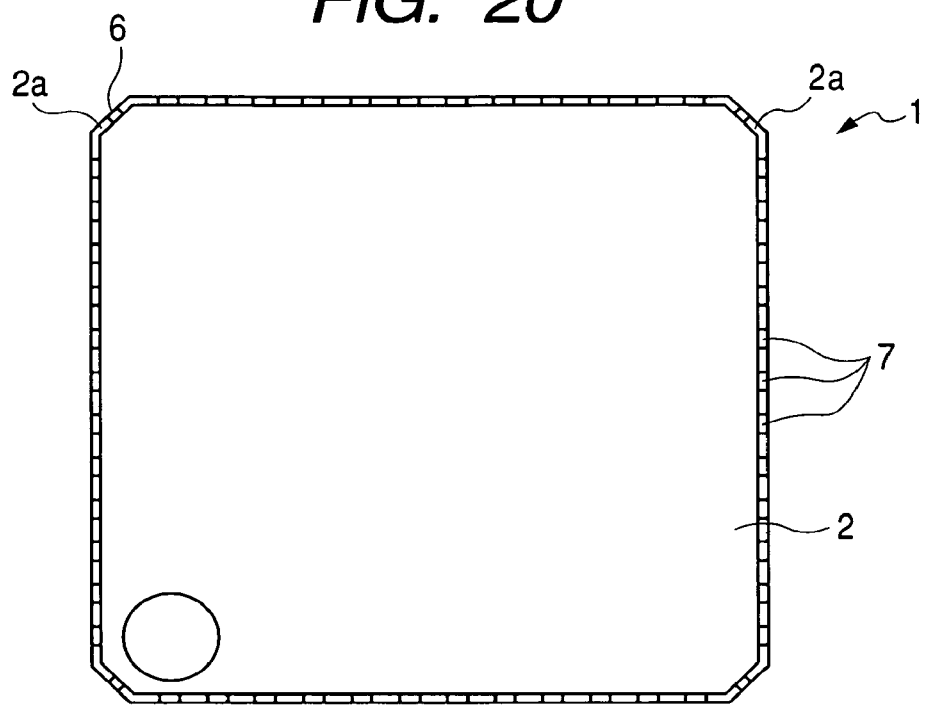
FIG. 20 is a plan view of the high frequency power module of the embodiment 5.
Figure 21:
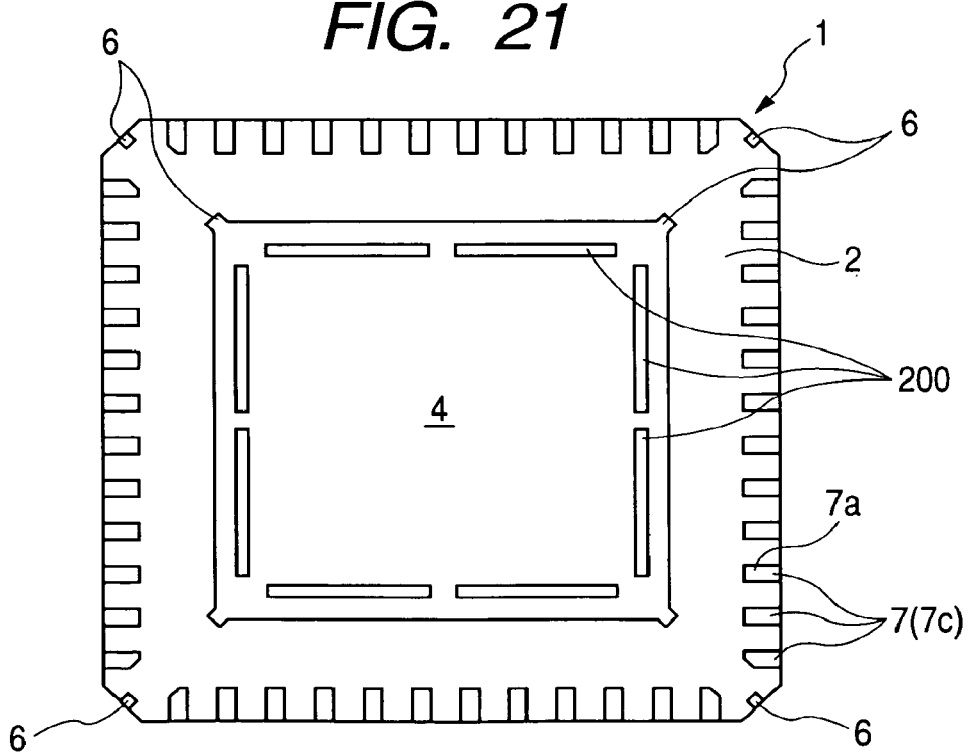
FIG. 21 is a bottom plan view of the high frequency power module of the embodiment 5.

Here, the relationships among the chip mounting portion 4, the leads 7 and the tab suspending lead 6 are explained. The plurality of leads 7, as shown in FIG. 19, include first portions 7c whose back surfaces (lower surfaces) are exposed from the back surfaces of the resin sealing body 2 and second portions 7d which extend toward inside of the chip mounting portion 4 and, the lower surfaces of the second portions 7d are removed by etching by a fixed thickness. Accordingly, the leads 7 have the structure that the second portions 7d have a thickness smaller than the thickness of the first portions 7c and whole of the second portions 7d is covered in the inside of the resin sealing body 2. Further, since, in middle portions of the tab suspending lead 6 also, the lower surface are etched by a given thickness similarly as the above-mentioned second portions 7d, the resin intrudes into the etched portions at the transfer molding and hence, the tab suspending leads 6 is only partially exposed from the back surface of the resin sealing body 2. Further, the first portions 7c of the leads 7 are projected to the periphery of the resin sealing body 2 in such a manner that the first portions 7c are exposed from a side surface (peripheral surface) of the resin sealing body 2. The projection length thereof is less than approximately 0.1 mm.

The second portions 7d of the leads 7 are embedded in the inside of the resin sealing body 2 and an insulation resin is interposed between end portions (wire connection portions) of the second portions 7d and the outer peripheral portion of the chip mounting portion 4 and hence, the ends of the second portions 7d can be arranged close to the chip mounting portion 4.

Figure 29:
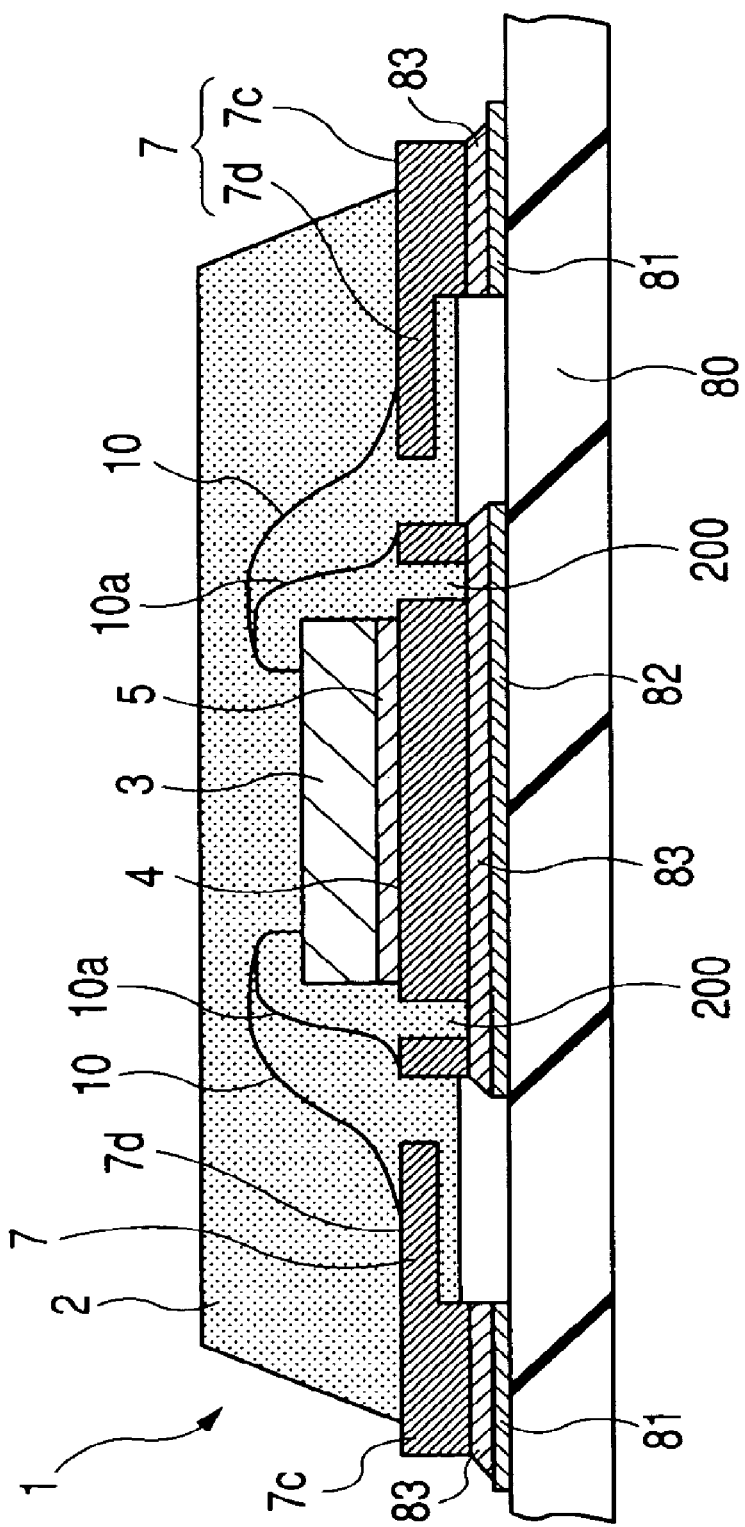
FIG. 29 is a schematic cross-sectional view showing a mounted state of the high frequency power module of the embodiment 5.

That is, the second portions 7d of the leads 7 have the structure that the second portions 7d are not exposed from the back surface of the resin sealing body 2 and extend in the inside of the resin sealing body 2. Accordingly, as shown in FIG. 29, in mounting the high frequency power module 1 on the mounting board 80, when the leads 7 and the chip mounting portion 4 are fixed to a land 81 or a fixing portion 82 of the mounting board 80 by way of solder 83, since it is unnecessary to consider that the solder 83 which fixes the lead 7 and the land 81 and the solder 83 which fixes the chip mounting portion 4 to the fixing portion 82 are brought into contact or come so close to each other that an electrical short-circuiting is generated, the end portions of the second portions 7d can be brought close to the outer peripheral portion of the chip mounting portion 4.

In this manner, by embedding the second portions 7d of the leads 7 into the resin sealing body 2, the pattern of the above-mentioned second portions 7d can be determined independently from the shape of the portions serving as external electrodes (first portions 7c).

Therefore, to obtain the pair characteristics of the input signals (complementary signals), the pattern of the leads 7 (the first portions 7c and the second portions 7d) can be determined so as to make the lengths of the wires 10 which are connected to the first electrode terminals 9a and the second electrode terminals 9b equal. In the embodiment 5, the first electrode terminals 9a are arranged closer to corner portions of the semiconductor chip 3 than the second electrode terminals 9b and the end portions of the second portions 7d of the leads 7 which are electrically connected to the first electrode terminals 9a extends to a position close to a side of the semiconductor chip 3 than end portions of the second portions 7d of the leads 7 which are electrically connected to the second electrode terminals 9b (see FIG. 23A). Then, the length of the conducive wires 10 which connect the first electrode terminals 9a and the second portions 7d of the leads 7 and the length of the conducive wires 10 which connect the second electrode terminals 9b and the second portions 7d of the leads 7 are set to L0, that is, the substantially equal length.

On the other hand, in the case of the leads 7 having no second portions 7d shown in FIG. 23B, the lengths of the conductive wires 10 which connect the leads 7 arranged close to each other and the electrode terminals 9a, 9b arranged close to each other are set to L1, L2 respectively and longer than the above-mentioned L0 and hence, the inductances are increased and the high frequency characteristics is degraded.

Further, since the lengths of L1 and L2 are different from each other, the difference between the inductances increases and the pair characteristics of the input signals are degraded.

For example, in case an Au wire having a diameter of 25 μm is used as a wire, when the operational frequency band assumes GHz order, even the difference of the wire lengths by only 0.5 mm causes the difference of 0.5 nH (nano Henry). Accordingly, there is a possibility that the pair characteristics of the complementary input signals is remarkably damaged.

As a profile standard of QFN, the leads 7 which are arranged in the periphery of the back surface of the resin sealing body 2 serve as external electrode terminals and hence, it is necessary that the leads 7 are arranged in parallel at a given pitch.

In the embodiment 5, as shown in FIG. 23A, the lead 7 includes the first portion 7c which exposes the lower surface thereof from the back surface of the resin sealing body 2 and the second portion 7d which extends from the first portion 7c and extends in a embedded state in the inside of the resin sealing body 2, the second portion 7d can be extended in the free direction as explained previously and hence, the leads which are arranged close to each other can be respectively extended in the desirable directions whereby the lengths of the wires 10 between the leads 7 which are arranged close to each other and the electrode terminals 9 which are arranged close to each other can be set to substantially equal (L0). This result allows the length of the wire 10 which connects the first electrode terminals 9a and the lead 7 and the length of the wire 10 which connects the second electrode terminals 9b and the lead 7 to have the equal length and allows the respective wires 10 to have same inductance.

Further, as described above, the second portion 7d of the lead 7 is positioned in the inside of the sealing body 2 and is not exposed from the back surface of the resin sealing body 2 and hence, the second portion 7d of the lead 7 can extend in the free direction. That is, as shown in 24A, the extending direction of the second portion 7d can be aligned with the extending direction of the wire 10 and hence, the wire 10 can be positioned within the width of the distal end of the lead 7 whereby the length of the connection portion of the wire 10 can be made long as "f".

FIG. 24B is a view of a case when the lead 7 is formed of only the first portion 7c. Since the first portion 7c comprises the external electrode terminal in the back surface of the resin sealing body 2, respective external electrode terminals are arranged in parallel with a given gap therebetween. Accordingly, as shown in FIG. 24B, as the external electrode terminal is arranged closer to a corner of the rectangular resin sealing body 2, the intersection angle θ of the wire against the external electrode terminal is increased and the wire 10 is configured to be displaced from a width of the lead 7 and to intersect the side periphery of the lead 7 and hence, the connection length of the wire 10 to the lead 7 assumes h and becomes shorter than the connection length f.

As described in conjunction with the embodiment 5, as shown in FIG. 24A, by making the extending direction of the second portion 7d aligned with the stretch direction of the wire 10, the connection length between the lead 7 and the wire 10 can be elongated as "f". Accordingly, the connection strength of the wire can be increased and the reliability of the connection of the wire (wire bonding) can be enhanced.

Further, the pair characteristics of the input signals is similarly important also in the RFVCO44 which processes a high frequency signal. In the embodiment 5, as shown in FIG. 25, two wires 10 which are two signal lines which extend in the RFVCO44 are also configured to have the same wire length. Further, the electromagnetic shielding is applied to two signal lines by ground lines arranged at both sides of the two signals and hence, the generation of crosstalk can be prevented.

Figure 26:
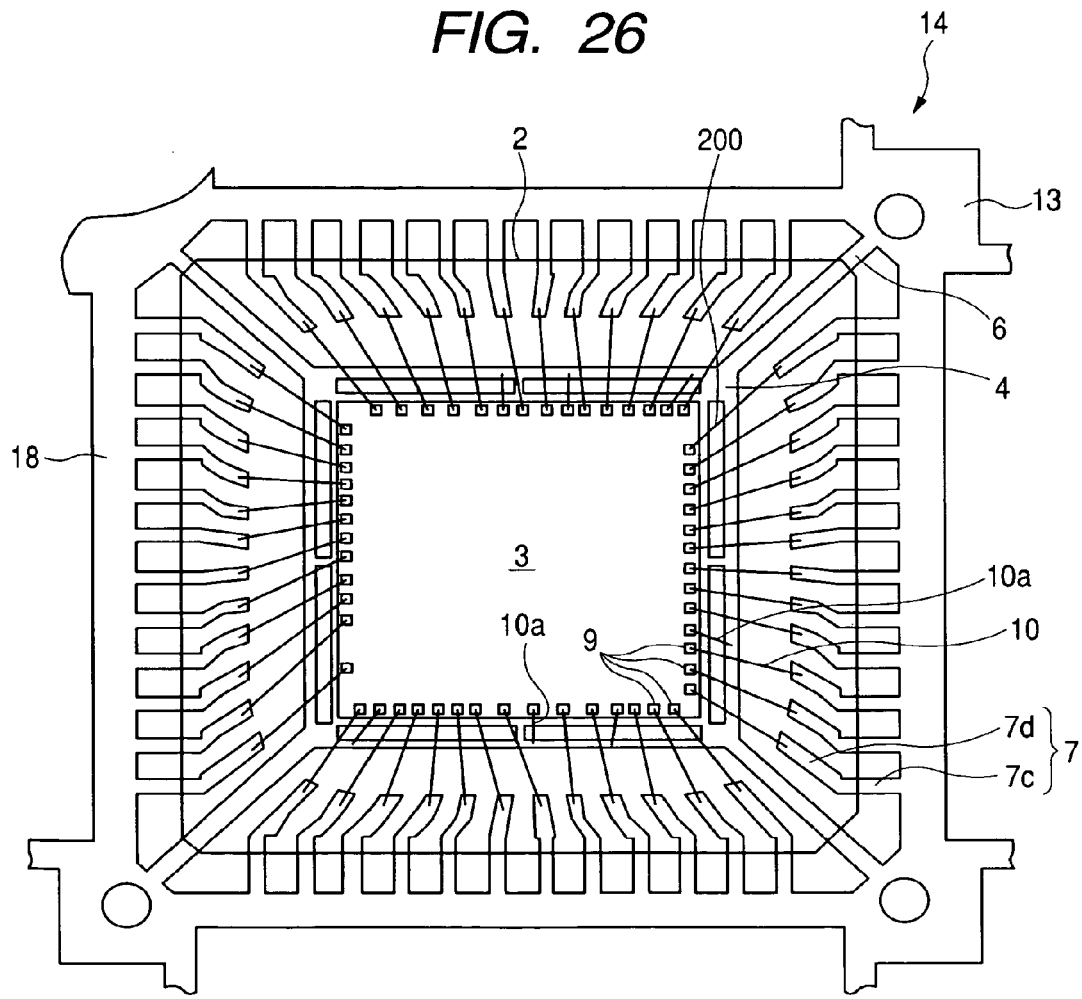
FIG. 26 is a plan view of a portion of a lead frame showing a state that electrodes of a semiconductor chip which is fixed to the lead frame and the leads are connected with each other with wires in the manufacture of the high frequency power module of the embodiment 5.

FIG. 26 is a plan view showing a portion of the manufacture of the high frequency power module and a view showing a portion of a lead frame in a state that the electrode terminals 9 of the semiconductor chip 3 which is fixed to the lead frame 13 and the leads 7 are connected with each other using the wires 10. Since the manufacturing method of the high frequency power module 1 according to the embodiment 5 is substantially similar to the manufacturing method of the high frequency power module 1 of the embodiment 1, the explanation thereof is omitted.

Figure 27:
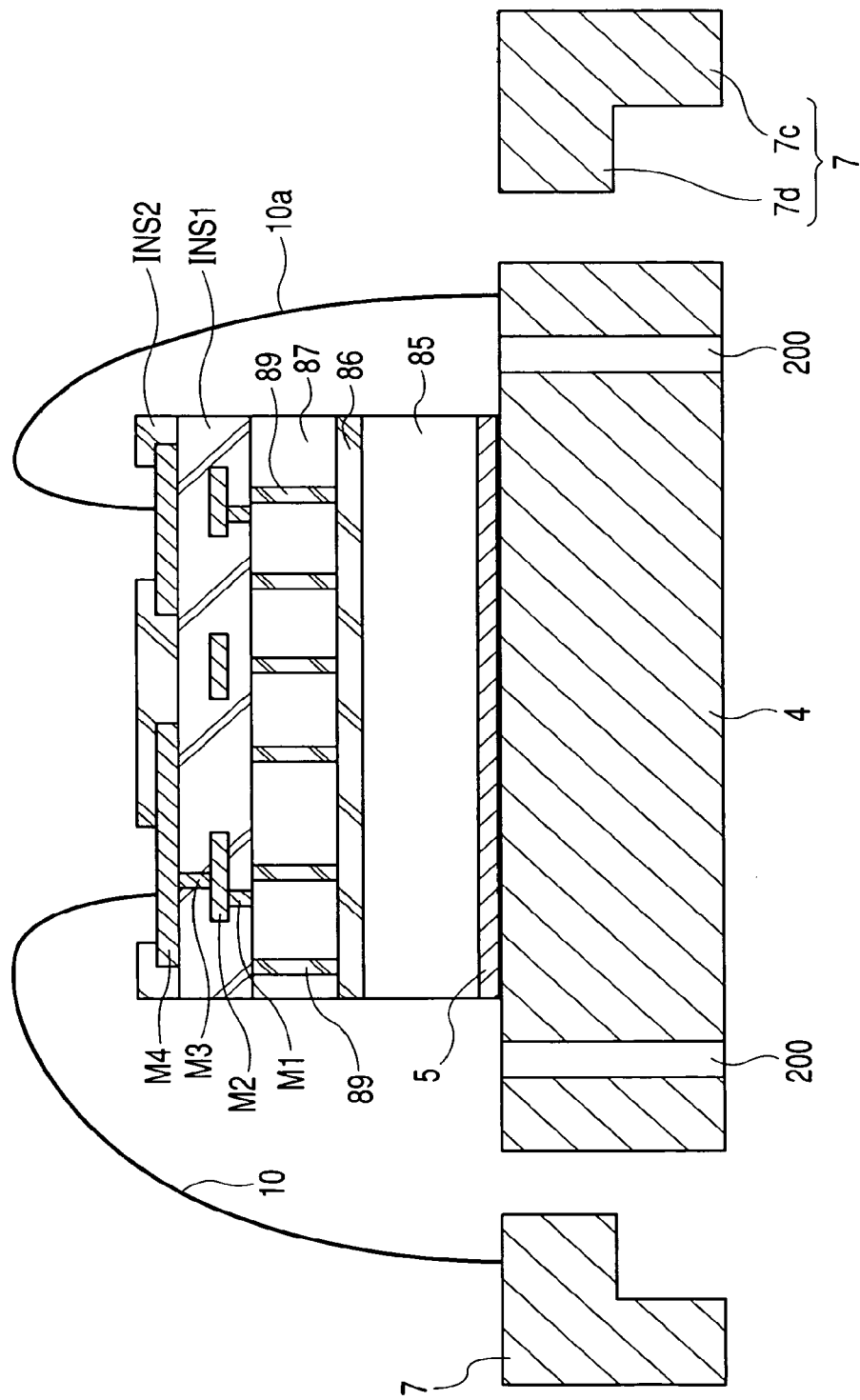
FIG. 27 is a schematic enlarged cross-sectional view of internal constitution of the semiconductor chip of the high frequency power module of the embodiment 5 and the wire connection state.

In the embodiment 5, as shown in the schematic enlarged cross-sectional view of FIG. 27, the semiconductor chip 3 is mounted on the chip mounting portion 4 by way of an adhesive agent 5. The semiconductor chip 3 includes a first semiconductor substrate 85, an insulation layer 86 formed over the surface of the first semiconductor substrate 85, a second semiconductor substrate 87 formed over the insulation layer 86 and, the plurality of electrode terminals 9 are formed over the main surface of the second semiconductor substrate 87, the plurality of circuit parts are formed over the second semiconductor substrate 87 and the back surface of the first semiconductor substrate 85 of the semiconductor chip 3 is electrically connected to the chip mounting portion 4 by way of a conductive adhesive agent 5.

The first semiconductor substrate 85 is a P type silicon board and the second semiconductor substrate 87 is an N type silicon board. Both of the first semiconductor substrate 85 and the second semiconductor substrate 87 are laminated by way of the insulation layer 86 thus forming an SOI structure (silicon on insulator). The plurality of electrode terminals 9 arranged over the upper surface of the semiconductor chip 3 respectively form signal electrode terminals, power source potential electrode terminals and reference power source potential electrode terminals. The wires 10 which connect the chip mounting portion 4 and the electrode terminals 9 of the semiconductor chip 3 are down-bond wires 10a and fix the chip mounting portion 4 to the ground potential or the negative potential. When the chip mounting portion 4 is fixed at the negative potential, the first semiconductor substrate 85 is fixed at the negative potential and hence, a depletion layer extends to the first semiconductor substrate 85 side.

Therefore, it is possible to reduce a parasitic capacitance which is applied to the plurality of circuit parts formed over the second semiconductor substrate 87 thus providing the effect of rapid operation of the circuit.

In the second semiconductor substrate 87, a large number of isolation grooves whose lower bottoms reach the insulation layer 86 are formed. In these isolation grooves, insulation bodies 89 are filled and a region surrounded by the isolation grooves forms an island which is electrically independent. Then, over the surface of the second semiconductor substrate 87 surrounded by respective isolation grooves, an N-type and a P-type semiconductor layers (N, P) having given impurity concentrations are wholly or partially formed thus forming the semiconductor elements including a given pn junction. Further, this embodiment is configured such that, over the surface of the second semiconductor substrate including the respective electric elements, insulation layers INS1, INS2 such as a silicon oxide film or the like or a metal wiring layer such as aluminum, cupper or the like, conductors M1 to M4 connecting the upper and the lower wiring layers are sequentially formed and, as shown in FIG. 27, the plurality of electrode terminals 9 are formed in the uppermost layer wiring M4.

Figure 28:
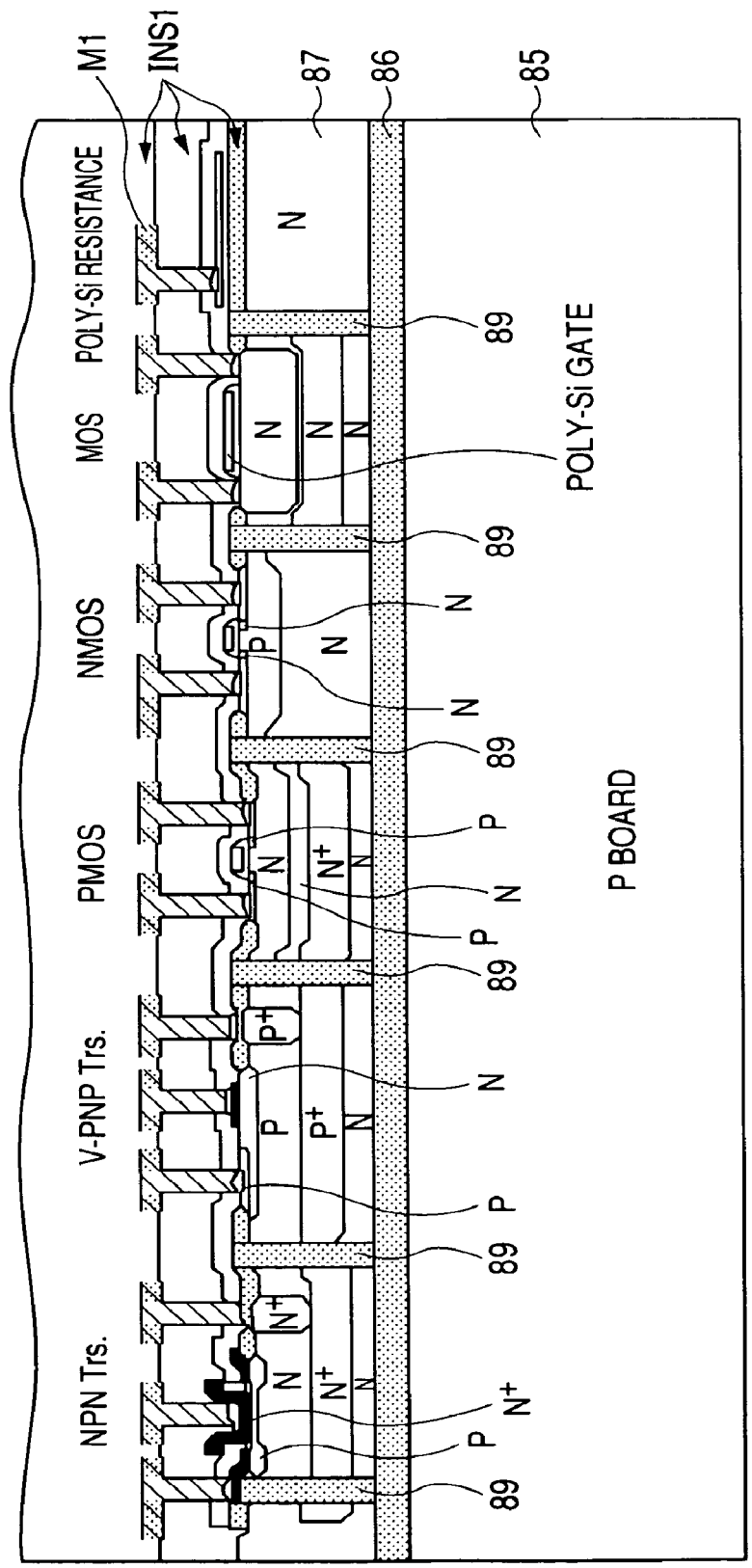
FIG. 28 is a schematic enlarged cross-sectional view of internal constitution of the semiconductor chip of the high frequency power module of the embodiment 5.

FIG. 28 is a schematic cross-sectional view showing a detailed structure of the chip shown in FIG. 27 and, as semiconductor elements, in order from left to right, an NPN vertical transistor (NPN Trs), a PNP vertical transistor (V-PNP Trs), a P channel type MOS transistor (PMOS), an N channel type MOS transistor (NMOS), a MOS capacitance and a resistance (polysilicon resistance) are shown. Then, by combination of these plurality of semiconductor elements, the high frequency power module (semiconductor device) 1 shown in FIG. 3 is formed.

Here, in the manufacture of such a high frequency power module 1, the first semiconductor substrate 85 is prepared and, thereafter, the second semiconductor substrate 87 is laminated to the first semiconductor substrate 85 by way of the insulation layer 86. Then, after the semiconductor substrate 87 is formed with a given thickness, the second semiconductor substrate 87 is selectively removed by etching with a given thickness. Subsequently, desired semiconductor layers are selectively and repeatedly formed and respective semiconductor elements are formed and, at the same time, the isolation grooves are formed and the insulation body 89 is formed. Then, the wiring structure is formed and, finally, the first semiconductor substrate 85 is cut longitudinally and laterally so as to form the semiconductor chip 3.

In the high frequency power module 1 according to the embodiment 5, the low noise amplifier (LNA) 24 which processes high frequency signals and the RFVCO 44 adopt two input-two output constitution and, at the same time, to ensure the pair characteristics of two input signals, the lengths of the wires 10 of two inputs are set to the equal length. Further, with respect to the length of the wires 10 forming the signal line, by connecting the wire 10 to the electrode terminal 9 of the semiconductor chip 3 and to the end portion of the second portion 7d of the lead 7, the length of the wire is made short so as to reduce the wire inductance. Accordingly, the enhancement of the high frequency characteristics (DC offset being small) can be achieved.

Figure 33:
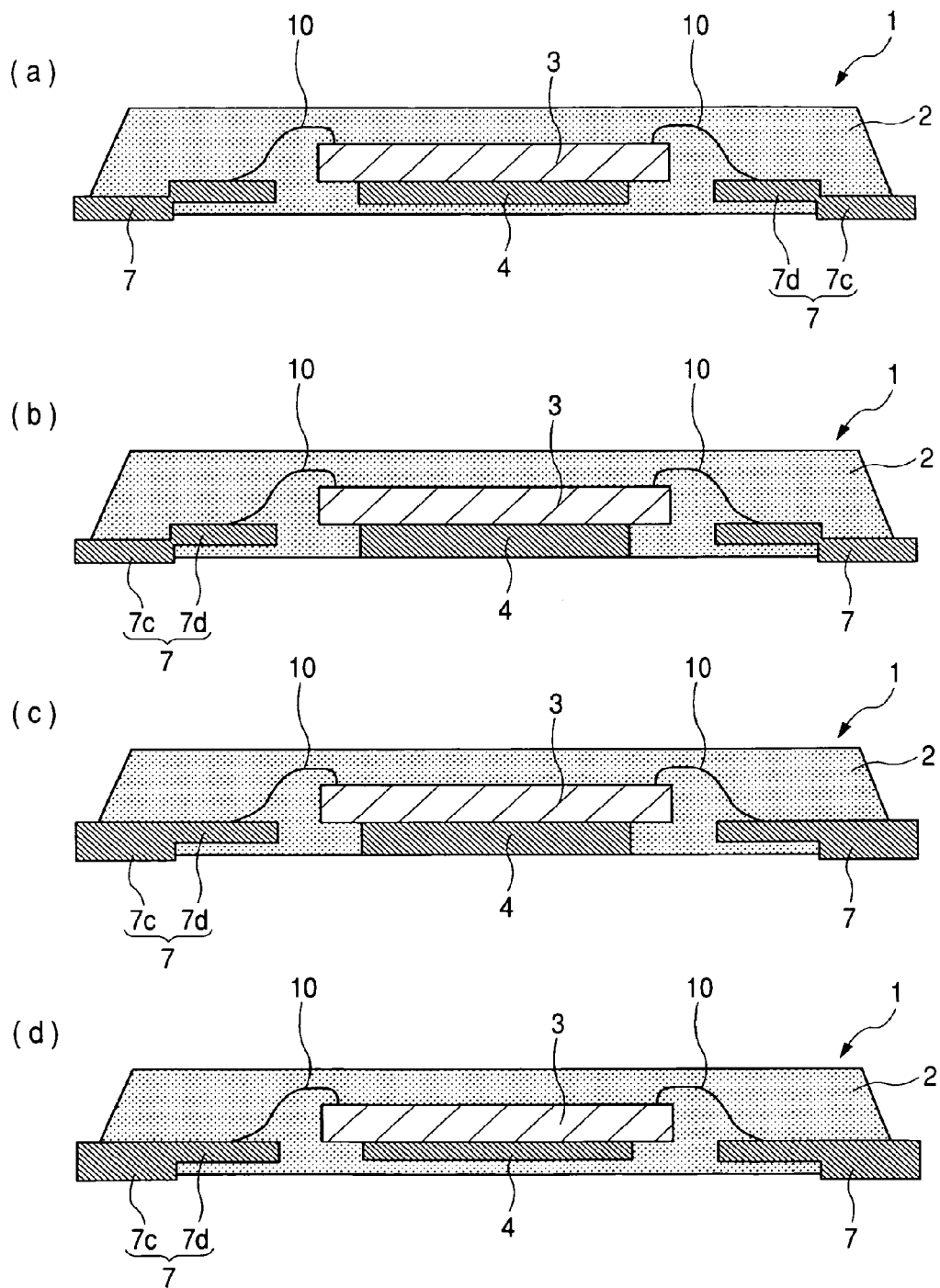
FIG. 33 is a schematic cross-sectional view of the high frequency power module showing several another modifications of the small tab constitution.
Figure 34:
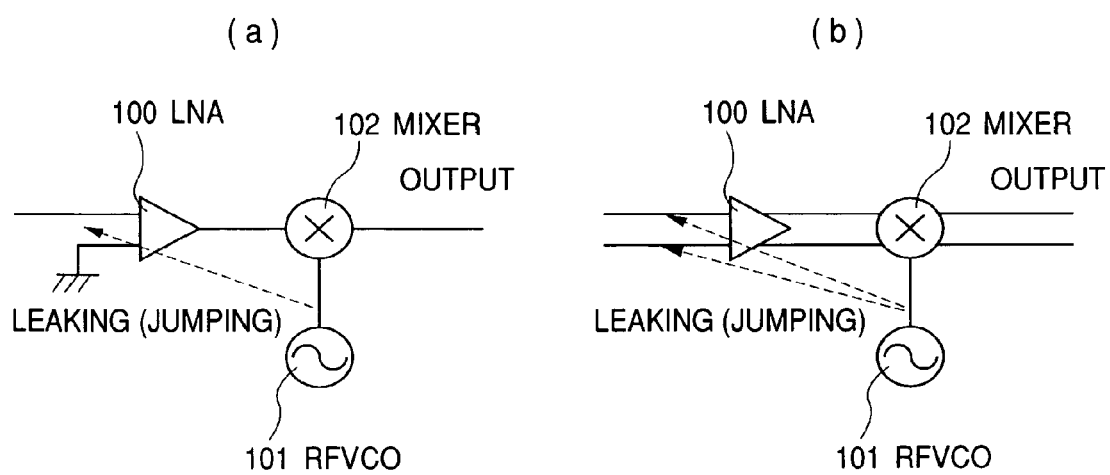
FIG. 34 is a block diagram including a two input differential amplifying circuit part (LNA) in a mobile phone and a block diagram including a one input differential amplifying circuit part (LNA) in a mobile phone.

In other words, in the embodiment 5, three low noise amplifiers (LNA) 24 for GSM, DCS and PCS communications are comprised of two-input-type differential low-noise amplifiers (differential amplifiers) shown in FIG. 33B. That is, respective low-noise amplifiers (LNA) 24 according to the embodiment 5 is comprised of two unit amplifiers to which signals having phases inverted from each other (complimentary signals) are inputted. Accordingly, even there is a case when the output signal from the 90-degree phase shifter 40 leaks into the LNA input line, a complementary signal is inputted and hence, the components having the same phase is cancelled and the amplifying is not performed in the LNA 24 whereby the DC offset is decreased. Accordingly, in the communication system in which the carrier frequency band becomes high, it is possible to obtain an advantageous effect that the DC offset characteristic deterioration is suppressed.

Further, the high frequency power module 1 according to the embodiment 5 has advantageous effects of decreasing a DC offset and suppressing the lowering of gain.

Embodiment 6

Figure 31:
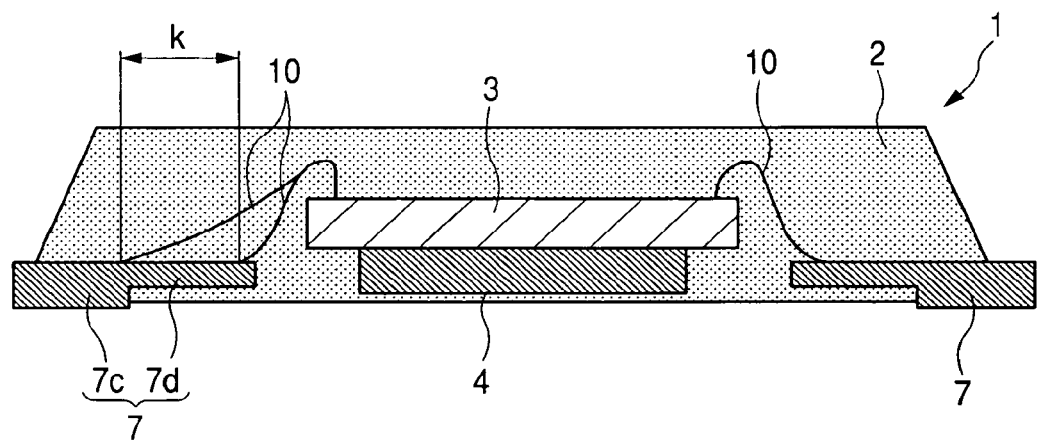
FIG. 31 is a schematic cross-sectional view of the high frequency power module of another embodiment (embodiment 6) of the present invention having the constitution in which a tab which supports the semiconductor chip is smaller than a semiconductor chip (the small tab constitution).
Figure 32:
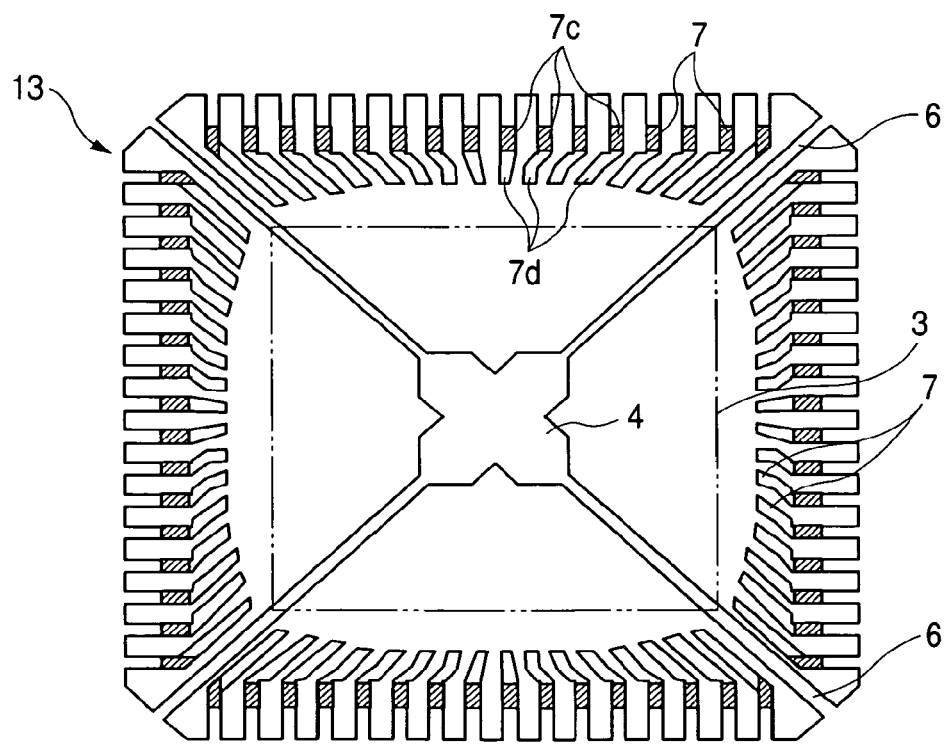
FIG. 32 is a schematic plan view showing a portion of a lead frame having the small tab constitution which is used in the manufacture of the high frequency power module of the embodiment 6.

FIG. 31 is a schematic cross-sectional view of a high frequency power module having a constitution in which a tab supporting a semiconductor chip is set smaller than the semiconductor chip (small tab constitution) according to another embodiment (embodiment 6) of the present invention and FIG. 32 is a schematic plan view showing a part of the lead frame having the small tab constitution used in the manufacture of the high frequency power module according to the embodiment 6.

The high frequency power module 1 according to the embodiment 6 has the structure in which, in the high frequency power module 1 according to the embodiment 5, a small tab constitution in which the chip mounting portion 4 is smaller than the semiconductor chip 3 is adopted. Further, middle portions of the tab suspending leads 6 not shown in the drawing are bent in a step-like manner by one step so that lower surfaces of the chip mounting portion 4 become higher than the lower surfaces of the first portions 7c of the leads 7 and hence, the chip mounting portion 4 is embedded in the inside of the resin sealing body 2. That is, the embodiment 6 is characterized in that stepped portions are formed between the chip mounting portion 4 and the first portions 7c of the leads 7 and, the chip mounting portion 4 is positioned in the inside of the resin sealing body 2. Accordingly, soldering is not applied to a portions right below the wire bonding portions and, at the time of mounting the semiconductor chip over the mounting board, it is not influenced by the stress from the board when the temperature changes and the connection reliability can be enhanced.

As shown in FIG. 31, with respect to the wires 10 connecting the semiconductor chip 3 and the leads 7, as the connection position of the wires 10 to the leads 7 is shown by two-dot chain line, by connecting the wires 10 to the end portion of the second portions 7d of the leads 7 but not to the end portions of the first portions 7c of the leads 7 but the length of the wires can be shortened by approximately k.

The high frequency power module 1 according to the embodiment 6 also possesses some of advantageous effects provided by the high frequency power module 1 according to the embodiment 1. As shown in FIG. 32, by adopting the structure in which the tab (chip mounting portion) 4 is smaller than the semiconductor chip 3, the general-purpose property of the lead frame can be enhanced and the reduction of the manufacturing cost of the high frequency power module 1 can be achieved.

FIGS. 33A to 33D are schematic cross-sectional views of the high frequency power module showing some other modified examples of the small tab constitution. FIG. 33A has the structure in which the second portions 7c extend from the first portions 7c of the leads 7 in a bending manner and the second portions 7d are positioned in the inside of the resin sealing body 2. Due to such a constitution, in the process of forming the lead frame, the leads 7 and the tab suspending lead 6 are formed by bending with one-stepped portions in midst portions thereof and, in the leads 7, the second portions 7c which extend from the first portions 7c in a bending manner by this bending operation are formed in the leads 7 and, by the bending of the tab suspending leads 6, the chip mounting portion 4 is embedded in the inside of the sealing body 2. With this structure, the selective etching process of the leads, the chip mounting portion 4 and the tab suspending leads 6 become unnecessary and the reduction of the manufacturing cost of the high frequency power module 1 can be achieved.

FIG. 33B shows the structure having the second portions 7d which extend from the first portions 7c in a bending manner by bending only the leads 7 without bending the tab suspending leads 6. In this example, since the structure which exposes the chip mounting portion 4 on the lower surface of the resin sealing body 2 is adopted, the heat radiation effect from the lower surface of the chip mounting portion 4 is increased. Accordingly, the heat radiation property of the semiconductor elements mounted over the chip mounting portion 4 becomes improved and the stable operation can be achieved.

FIG. 33C shows the structure in which, in the high frequency power module 1 according to the embodiment 5, the chip mounting portion 4 is made as a smaller tab than the semiconductor chip 3 and hence, the general-purpose property of the lead frame is enhanced and the reduction of the manufacturing cost of the high frequency power module 1 can be achieved.

FIG. 33D shows an example in which, in the high frequency power module 1 according to the embodiment 5, the chip mounting portion 4 is made as a smaller tab than the semiconductor chip 3 and, at the same time, the chip mounting portion 4 is formed thin by etching the lower surface of the chip mounting portion 4 similarly as the second portion 7d of the lead 7.

Due to the small tab constitution, the general-purpose property of the lead frame which is used in the manufacture can be enhanced and hence, the reduction of the manufacturing cost of the high frequency power module 1 can be achieved.

The inventions made by inventors of the present invention have been specifically explained heretofore based on the embodiments, however, the present invention is not limited to the above-mentioned embodiments and various modifications can be made without departing from the gist of the present invention.

Although only the common use or separation of power source potential is described with respect to only ground potential in the previously-mentioned embodiments, the range of application of the present invention is not limited to the ground potential and the relevant constitution thereof and, by focusing on an appropriate power source potential (first potential) in applying the invention, for example, the power source potential which can reduce the number of the leads 7 by making the electrodes common, the present invention may be applied to the constitutions of electrode terminals 9 or the leads 7 for supplying the power source potential.

In the previously-mentioned embodiments, although an example in which the present invention is applied to the manufacture of a QFN type semiconductor device is explained, for example, the present invention may be similarly applied to the manufacture of an SON type semiconductor device and the substantially same advantageous effects can be obtained. Further, the present invention is not limited to the non-lead type semiconductor device and the present invention can be similarly applied to, for example, a semiconductor device which is called a QFP (Quad Flat Package) or an SOP (Small Outline Package) in which leads bent in a gull wing shape are projected along the periphery of the sealing body 2. However, compared to the previously-mentioned QFP or SOP, for achieving the miniaturization of the device, it is preferable to adopt the QFP type structure having small projection amount of the leads at the periphery of the sealing body 2.

The advantageous effects obtained by typical invention among the inventions which are disclosed in this application are explained as follows.

(1) A semiconductor device having a down-bonding structure in which cross talk is hardly generated can be provided.

(2) It is possible to provide the high frequency power module which incorporates the semiconductor element in which the respective circuit parts such as the low noise amplifier, the mixer, the VCO, the synthesizer, the IQ modulator/demodulator, the DC-AC modulator are formed in a monolithic manner, wherein the ground potential of the specific circuit part such as the low noise amplifier, RFVCO or the like hardly receives the influence of the ground potentials of the remaining circuit parts.

(3) It is possible to provide the non-lead type high frequency power module having the down-bonding structure which incorporates the semiconductor element in which the respective circuit parts such as the low noise amplifier, the mixer, the VCO, the synthesizer, the IQ modulator/demodulator, the DC-AC modulator are formed in a monolithic manner, wherein the ground potential of the specific circuit part such as the low noise amplifier, RFVCO or the like hardly receives the influence of the ground potentials of the remaining circuit parts.

(4) It is possible to provide the miniaturized and light-weighted high frequency power module which incorporates the semiconductor element in which the respective circuit parts such as the low noise amplifier, the mixer, the VCO, the synthesizer, the IQ modulator/demodulator, the DC-AC modulator are formed in a monolithic manner, wherein the ground potential of the specific circuit part such as the low noise amplifier, RFVCO or the like hardly receives the influence of the ground potentials of the remaining circuit parts.

(5) It is possible to provide the radio communication device which enables a favorable telephone call with small noise can be provided.

(6) A radio communication device which can cope with a plurality of communication systems which enable a favorable telephone call with small noise can be provided.

(7) As has been described heretofore, the semiconductor device according to the present invention is used for a radio communication device such as a mobile telephone or the like. Specifically, in a mobile telephone having a plurality of communication systems, ground electrode terminals of a circuit part which processes an extremely weak input signal such as a low noise amplifier are not connected to the tab serving as a common ground potential and but connected to the leads all of which are independent from each other and hence, when a communication system is used, crosstalk between the communication system and the other communication systems is not generated and a high frequency power module which enables a favorable telephone call can be provided.

(8) By forming the lead by a first portion comprising an external electrode terminal and a second portion extending in the inside of the resin sealing body, the pattern of the second portion can be selected freely and hence, the lead pattern in which the length of a wire connecting an electrode terminal of the semiconductor chip and the lead is made as short as possible can be selected. Accordingly, the reduction of the wire inductance can be realized.

(9) In a semiconductor device having two input constitution circuit parts such as a differential amplifier circuit part or the like, the lengths of the wires connected to the electrode terminals for two inputs can be set to equal length and the pair characteristics of the input signals can be obtained. Accordingly, when a low noise amplifier (LNA) or an RFVCO of a radio communication device adopts a two input constitution circuit part, the pair characteristics of the input signals can be obtained in each circuit part and the enhancement of the high frequency characteristics and the suppressing of the lowering of gain can be realized.

INDUSTRIAL APPLICABILITY

As has been described heretofore, the semiconductor device according to the present invention is used for a radio communication device such as a mobile telephone or the like. Specifically, in a mobile telephone having a plurality of communication systems, ground electrode terminals of a circuit part which processes an extremely weak input signal such as a low noise amplifier are not connected to the tab which has a common ground potential but are connected to the leads all of which are independent and hence, when a communication system is used, the crosstalk between the communication system and the other communication systems is not generated and hence, a high frequency power module which enables a favorable telephone call can be provided.

The invention claimed is:

1. A semiconductor device for use in a radio communication device, comprising:
    a semiconductor chip including a voltage controlled oscillator, a first differential low noise amplifier, and a second differential low noise amplifier;
    a chip mounting portion over which the semiconductor chip is mounted;
    a plurality of leads disposed around the chip mounting portion; and
    a resin sealing body covering the semiconductor chip, parts of the leads, and part of the chip mounting portion,
    wherein the chip mounting portion is exposed from a back surface of the resin sealing body,
    the first and second low noise amplifiers are disposed side by side,
    each of the first and second low noise amplifiers has a pair of radio signal inputs,
    a first pair of electrodes for the pair of radio signal inputs of the first low noise amplifier are disposed on a main surface of the semiconductor chip side by side,
    a second pair of electrodes for the pair of radio signal inputs of the second low noise amplifier are disposed on the main surface of the semiconductor chip side by side,
    a fifth electrode for providing ground potential to at least one of the first low noise amplifier and the second low noise amplifier is disposed on the main surface of the semiconductor chip,
    a sixth electrode for providing ground potential to the voltage controlled oscillator is disposed on the semiconductor chip,
    the first pair of electrodes are electrically connected with a first pair of leads of the plurality of leads via a first pair of conductive wires, respectively,
    the second pair of electrodes are electrically connected with a second pair of leads of the plurality of leads via a second pair of conductive wires, respectively,
    the fifth electrode is electrically connected with a fifth lead of the plurality of leads via a fifth conductive wire,
    the sixth electrode is electrically connected with the chip mounting portion via a sixth conductive wire,
    the fifth electrode is between the first and second pairs of electrodes, and the fifth conductive wire is between the first and second pairs of wires,
    the fifth electrode and the sixth electrode are electrically isolated from each other in the semiconductor device; and
    the fifth conductive wire and the sixth conductive wire are electrically isolated from each other in the semiconductor device.

2. The semiconductor device according to claim 1, wherein the semiconductor device has a Quad Flat Non-Leaded (QFN) structure.

3. The semiconductor device according to claim 1, wherein the leads of said first and second pairs of leads are bent in plan view.

4. The semiconductor device according to claim 1, wherein the first and second low noise amplifiers process a radio signal received by an antenna.

5. The semiconductor device according to claim 1, wherein the semiconductor device further comprises a modulator, a demodulator, and terminals for coupling with a base band circuit of the radio communication device,
    an output signal from the demodulator is supplied to one of said terminals for input into the base band circuit, and
    an input of the modulator is coupled to another of said terminals to receive an output signal from the base band circuit.

6. A semiconductor device for use in a radio communication device, comprising:
    a semiconductor chip including a voltage controlled oscillator, a first differential low noise amplifier, and a second differential low noise amplifier;
    a chip mounting portion over which the semiconductor chip is mounted;
    a plurality of leads disposed along the chip mounting portion; and
    a resin sealing body covering the semiconductor chip, parts of the leads, and part of the chip mounting portion,
    wherein the chip mounting portion is exposed from a back surface of the resin sealing body,
    each of the first and second low noise amplifiers has a pair of radio signal inputs,
    a first pair of electrodes for the pair of radio signal inputs of the first low noise amplifier are disposed on a main surface of the semiconductor chip, the first pair of electrodes including a first electrode and a second electrode,
    a second pair of electrodes for the pair of radio signal inputs of the second low noise amplifier are disposed on the main surface of the semiconductor chip, the second pair of electrodes including a third electrode and a fourth electrode,
    a fifth electrode for providing ground potential to at least one of the first low noise amplifier and the second low noise amplifier is disposed on the main surface of the semiconductor chip,
    a sixth electrode for providing ground potential to the voltage controlled oscillator is provided on the semiconductor chip,
    the first to fifth electrodes are arranged along a lengthwise direction of a side of the semiconductor chip in the following order: the first electrode, the second electrode, the fifth electrode, the third electrode, and the fourth electrode, the first pair of electrodes are electrically connected with a first pair of leads of the plurality of leads via a first pair of conductive wires, respectively, the second pair of electrodes are electrically connected with a second pair of leads of the plurality of leads via a second pair of conductive wires, respectively, the fifth electrode is electrically connected with a fifth lead of the plurality of leads via a fifth conductive wire disposed between the first and second pairs of wires, the sixth electrode is electrically connected with the chip mounting portion via a sixth conductive wire, the fifth electrode and the sixth electrode are electrically isolated from each other in the semiconductor device; and the fifth conductive wire and the sixth conductive wire are electrically isolated from each other in the semiconductor device.

7. The semiconductor device according to claim 6, wherein the semiconductor device has a Quad Flat Non-Leaded (QFN) structure.

8. The semiconductor device according to claim 6, wherein the leads of said first and second pairs of leads are bent in plan view.

9. The semiconductor device according to claim 6, wherein the first and second low noise amplifiers process a radio signal received by an antenna.

10. The semiconductor device according to claim 6, wherein the semiconductor device further comprises a modulator, a demodulator, and terminals for coupling with a base band circuit of the radio communication device, an output signal from the demodulator is supplied to one of said terminals for input into the base band circuit, and an input of the modulator is coupled to another of said terminals to receive an output signal from the base band circuit.

11. A semiconductor device for use in a radio communication device, comprising:

a semiconductor chip including a voltage controlled oscillator, a first differential low noise amplifier, and a second differential low noise amplifier;

a chip mounting portion over which the semiconductor chip is mounted;

a plurality of leads disposed along the chip mounting portion; and a resin sealing body covering the semiconductor chip, parts of the leads, and part of the chip mounting portion, wherein the chip mounting portion is exposed from a back surface of the resin sealing body, each of the first and second low noise amplifiers has a pair of radio signal inputs, a first pair of electrodes for the pair of radio signal inputs of the first low noise amplifier are disposed on a main surface of the semiconductor chip, the first pair of electrodes including a first electrode and a second electrode, a second pair of electrodes for the pair of radio signal inputs of the second low noise amplifier are disposed on the main surface of the semiconductor chip, the second pair of electrodes including a third electrode and a fourth electrode, a fifth electrode for providing ground potential to at least one of the first low noise amplifier and the second low noise amplifier is disposed on the main surface of the semiconductor chip, a sixth electrode for providing ground potential to the voltage controlled oscillator is provided on the semiconductor chip, the first to fifth electrodes are arranged along a lengthwise direction of a side of the semiconductor chip in the following order: the first electrode, the second electrode, the fifth electrode, the third electrode, and the fourth electrode, the first pair of electrodes are electrically connected with a first pair of leads of the plurality of leads via a first pair of conductive wires, respectively, the second pair of electrodes are electrically connected with a second pair of leads of the plurality of leads via a second pair of conductive wires, respectively, the fifth electrode is electrically connected with one of a fifth lead of the plurality of leads and the chip mounting portion via a fifth conductive wire disposed between the first and second pairs of wires, the sixth electrode is electrically connected with the other of the chip mounting portion and the fifth lead via a sixth conductive wire, the fifth electrode and the sixth electrode are electrically isolated from each other in the semiconductor device; and the fifth conductive wire and the sixth conductive wire are electrically isolated from each other in the semiconductor device.

12. The semiconductor device according to claim 11, wherein the semiconductor device has a Quad Flat Non-Leaded (QFN) structure.

13. The semiconductor device according to claim 11, wherein the leads of said first and second pairs of leads are bent in plan view.

14. The semiconductor device according to claim 11, wherein the first and second low noise amplifiers process a radio signal received by an antenna.

15. The semiconductor device according to claim 11, wherein the semiconductor device further comprises a modulator, a demodulator, and terminals for coupling with a base band circuit of the radio communication device, an output signal from the demodulator is supplied to one of said terminals for input into the base band circuit, and an input of the modulator is coupled to another of said terminals to receive an output signal from the base band circuit.

16. A semiconductor device for use in a radio communication device, comprising:

a semiconductor chip including a voltage controlled oscillator, a first radio signal amplifier, and a second radio signal amplifier;

a chip mounting portion over which the semiconductor chip is mounted;

a plurality of leads disposed along the chip mounting portion; and a resin sealing body covering the semiconductor chip, parts of the leads, and part of the chip mounting portion, wherein the chip mounting portion is exposed from a back surface of the resin sealing body, each of the first and second radio signal amplifiers has a pair of radio signal inputs, a first pair of electrodes for the pair of radio signal inputs of the first radio signal amplifier are disposed on a main surface of the semiconductor chip, the first pair of electrodes including a first electrode and a second electrode, a second pair of electrodes for the pair of radio signal inputs of the second radio signal amplifier are disposed on the main surface of the semiconductor chip, the second pair of electrodes including a third electrode and a fourth electrode, a fifth electrode for providing ground potential to at least one of the first radio signal amplifier and the second radio signal amplifier is disposed on the main surface of the semiconductor chip, a sixth electrode for providing ground potential to the voltage controlled oscillator is provided on the semiconductor chip, the first to fifth electrodes are arranged along a lengthwise direction of a side of the semiconductor chip in the following order: the first electrode, the second electrode, the fifth electrode, the third electrode, and the fourth electrode, the first pair of electrodes are electrically connected with a first pair of leads of the plurality of leads via a first pair of conductive wires, respectively, the second pair of electrodes are electrically connected with a second pair of leads of the plurality of leads via a second pair of conductive wires, respectively, the voltage controlled oscillator has a first ground coupled to the sixth electrode, and the first and second radio signal amplifiers have second grounds, at least one of which is coupled to the fifth electrode, the first ground being electrically isolated from the second grounds in the semiconductor device, one of the fifth and sixth electrodes is electrically connected with the chip mounting portion by a downbonded wire, the other of the fifth and sixth electrodes is electrically connected with a fifth lead of the plurality of leads by an additional wire, the wire connected to the fifth electrode is disposed between the first and second pairs of wires, and the ground coupled said other of the fifth and sixth electrodes has no donwnbonded wire connection to the chip mounting portion.

17. The semiconductor device according to claim 16, wherein the second grounds are common with one another.

* * * * *